US009367650B2

(12) United States Patent
Gontowski et al.

(10) Patent No.: US 9,367,650 B2
(45) Date of Patent: Jun. 14, 2016

(54) SOLAR INSTALLATION MAPPING

(71) Applicant: eBay Inc., San Jose, CA (US)

(72) Inventors: Brian Gontowski, Hayward, CA (US); Gaurav Rekhi, San Jose, CA (US); Joe Augenbraun, Berkeley, CA (US)

(73) Assignee: eBay Inc., San Jose, CA (US)

( * ) Notice: Subject to any disclaimer, the term of this patent is extended or adjusted under 35 U.S.C. 154(b) by 379 days.

(21) Appl. No.: 14/152,693

(22) Filed: Jan. 10, 2014

(65) Prior Publication Data

US 2015/0199104 A1    Jul. 16, 2015

(51) Int. Cl.
- *G06F 17/50*    (2006.01)
- *G06Q 50/06*    (2012.01)
- *G01R 31/40*    (2014.01)

(52) U.S. Cl.
CPC ............... *G06F 17/50* (2013.01); *G06Q 50/06* (2013.01); *H02S 50/00* (2013.01)

(58) Field of Classification Search
USPC .................................................. 703/1, 2, 5, 6
See application file for complete search history.

(56) References Cited

U.S. PATENT DOCUMENTS

| | | | |
|---|---|---|---|
| 5,699,444 A | 12/1997 | Palm | |
| 2009/0234692 A1 | 9/2009 | Powell et al. | |
| 2010/0114537 A1 | 5/2010 | Pershing | |
| 2011/0205245 A1 | 8/2011 | Kennedy et al. | |
| 2013/0211790 A1* | 8/2013 | Loveland | ........... G06K 9/00637 703/1 |
| 2014/0200861 A1* | 7/2014 | DeVito | ............... G06F 17/5004 703/1 |
| 2015/0039460 A1* | 2/2015 | Parekh | .................. G06Q 30/08 705/26.3 |
| 2015/0040072 A1 | 2/2015 | Gontowski et al. | |

OTHER PUBLICATIONS

U.S. Appl. No. 14/138,039, Non Final Office Action mailed Sep. 16, 2015, 20 pgs.
U.S. Appl. No. 14/138,039, Response filed Dec. 15, 2015 to Non Final Office Action mailed Sep. 16, 2015, 10 pgs.
U.S. Appl. No. 14/138,038, filed Dec. 21, 2013, Three Dimensional Image Dimension Mapping.
U.S. Appl. No. 14/156,037, filed Jan. 15, 2014, Bi-Directional Project Information Updates in Multi-Party Bidding.
U.S. Appl. No. 14/138,039, Examiner Interview Summary mailed Jan. 14, 2016, 3 pgs.
U.S. Appl. No. 14/138,039, Final Office Action mailed Apr. 6, 2016, 11 pgs.

* cited by examiner

*Primary Examiner* — Thai Phan
(74) *Attorney, Agent, or Firm* — Schwegman, Lundberg & Woessner, P.A.

(57) ABSTRACT

In an example embodiment, a first set of estimated locations for calibration points in a roof is identified in a first satellite image, the first satellite image having a first zoom level and a first angle relative to ground. Then a second set of estimate locations for the calibration points is identified in a second satellite image, the second satellite image having a second zoom level and a second angle relative to ground. Actual locations for the calibration points are derived using the first and second sets of estimated locations, the first and second zoom levels, and the first and second angles. Then dimension information is calculated for the roof based on the derived actual locations for the calibration points.

20 Claims, 44 Drawing Sheets

Package Options

Sort By | ✓ Panels | Savings | Down Payment | Efficiency

10 Panels, 2.5 KW with Micro-Inverter

$102 Per Month (solar + utility) | $10,237.00 cash price
$0 Down Payment | See price breakdown Savings of $675/year
*Assuming $200 monthly electricity bill*

3602 | Installer Info | Joe Solar Company Inc | ☆☆☆☆☆ | ☐

| FINANCIAL OPTIONS | CURRENT BILL | PAY AS YOU GO (20 year lease) | PURCHASE (You own the system) |
|---|---|---|---|
| Electricity Costs (cents per kilowatt hour) | 15.9 | 12.9 (20% off utility cost) — 3604 | 10.3 (35% off utility cost) — 3606 |
| Down Payment | $120 | $0 | $2,800 (before rebate) |
| Monthly Payment | | $61 + $41 (solar & utility) | $0 + $41 (solar & utility) |
| Effective Savings | | $675 (per year) | $667 (per year) |
| Other Terms | | 2.9% (escalation) | $2,800 (rebates & tax credits) |

Finance Details ⌄

Electricity Bill
Enter your utility bill to view your savings
- ● Average Monthly Bill  [$200.00]
- ○ Detailed Bill

Pay as you go Benefits
Lorem Ipsum dolor sit amet consectetur
- ○ Lifetime Warranty
- ○ Installation Guarantee
- ○ Lorem Ipsum
- ○ Lorem Ipsum
- ○ Lorem Ipsum You Map Your Roof > We Analyze > You Size your Solar System > Get your Quote > Check Out

SOLAR INSTALLATION MAPPING

CROSS-RELATION TO RELATED APPLICATIONS

This application claims priority to U.S. Provisional Application No. 61/861,267 filed Aug. 1, 2013, which is hereby incorporated herein by reference in its entirety.

TECHNICAL FIELD

This application relates generally to data processing. More specifically, this application relates to data processing in the context of social and local commerce.

BACKGROUND

It has long been recognized that allowing consumers to design their own residential solar system would be desirable. For solar installers, lead generation and sales have become a dominant cost, while for consumers the process of dealing with sales people and getting multiple quotes is painful and time-consuming. Both buyer and seller would benefit from technology that would allow a consumer to design their own solar system since it could allow consumers to automatically generate a bid, all but eliminating sales costs and effort.

If the size and shape of a roof, its azimuth and inclination angles, and obstructions that shade the roof are known, solar system design is straightforward, and could potentially be automated. Professional solar installers collect this information by going on the roof and taking measurements and using instruments to determine shading. It is obviously impractical to expect a consumer to measure their roof and to have available the special instrument that measures shading.

BRIEF DESCRIPTION OF DRAWINGS

FIG. 36 is a screen capture illustrating the specialized user interface in accordance with another example embodiment.

DETAILED DESCRIPTION

The description that follows includes illustrative systems, methods, techniques, instruction sequences, and computing machine program products that embody illustrative embodiments. In the following description, for purposes of explanation, numerous specific details are set forth in order to provide an understanding of various embodiments of the inventive subject matter. It will be evident, however, to those skilled in the art that embodiments of the inventive subject matter may be practiced without these specific details. In general, well-known instruction instances, protocols, structures, and techniques have not been shown in detail.

While many of the concepts in this disclosure may be extended to areas other than solar panel coordination and installation, the present disclosure will focus on the aspects relevant to such solar panel embodiments. Nevertheless, this disclosure shall not be deemed to be limited to such embodiments, unless expressly claimed.

In an example embodiment, consumers may be presented with the ability to map (e.g., obtain the dimensions and angles of) their roofs automatically, allowing for an environment where users can obtain accurate bids for solar or other roofing projects (e.g., roof replacement) without the need for an installer to come and measure the roof in person. One key issue is allowing the consumer to specify with a reasonable degree of accuracy the size and shape of their roof, its inclination angle and azimuth, and how shaded it is.

Figure 1:
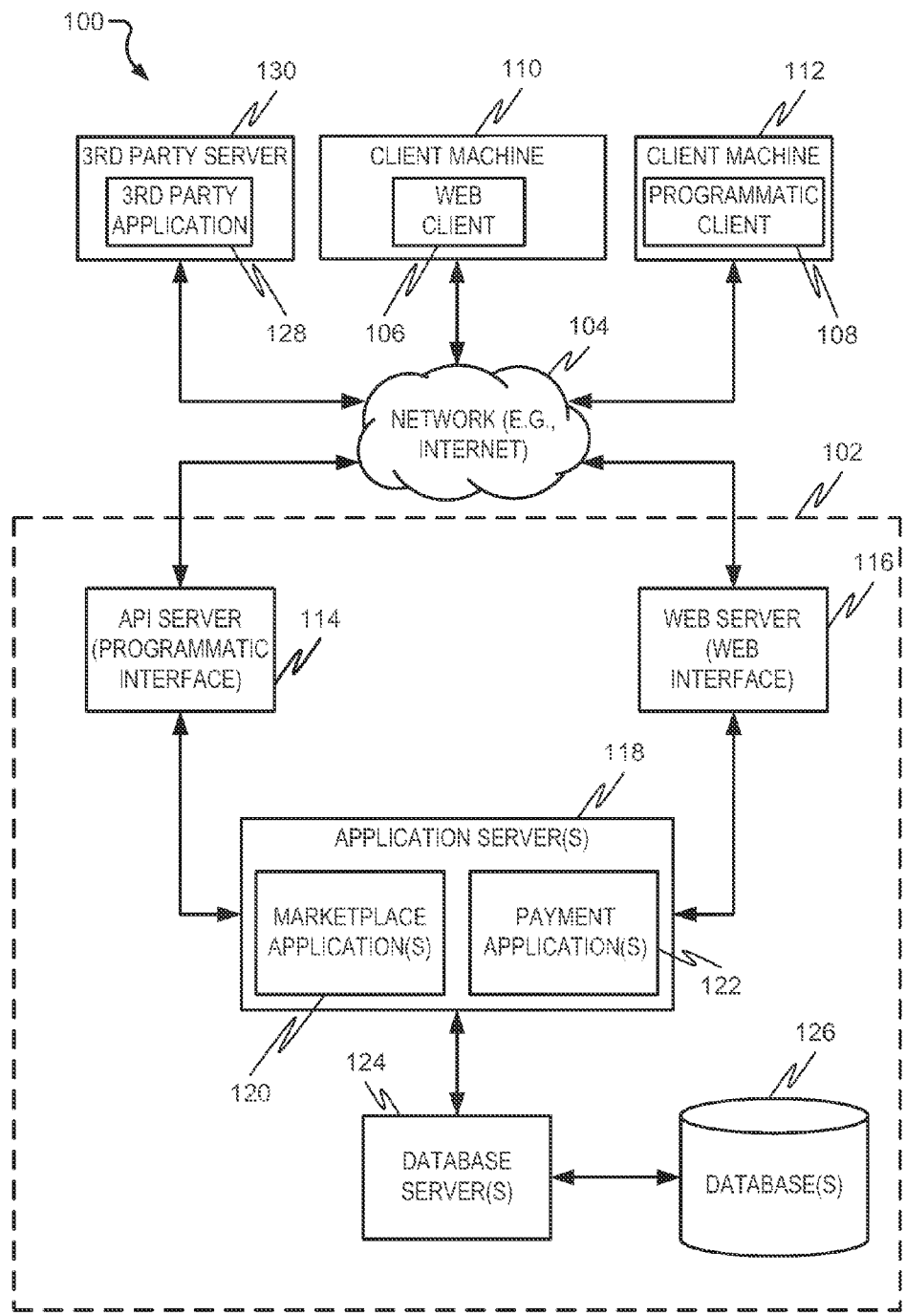
FIG. 1 is a network diagram depicting a client-server system, within which one example embodiment may be deployed.

In an example embodiment, the ability to automatically map roofs or other objects is integrated into an ecommerce service. FIG. 1 is a network diagram depicting a client-server system 100, within which one example embodiment may be deployed. A networked system 102, in the example forms of a network-based marketplace or publication system, provides server-side functionality, via a network 104 (e.g., the Internet or a Wide Area Network (WAN)), to one or more clients. FIG. 1 illustrates, for example, a web client 106 (e.g., a browser, such as the Internet Explorer browser developed by Microsoft Corporation of Redmond, Wash. State) and a programmatic client 108 executing on respective devices 110 and 112.

An Application Program Interface (API) server 114 and a web server 116 are coupled to, and provide programmatic and web interfaces respectively to, one or more application servers 118. The application servers 118 host one or more marketplace applications 120 and payment applications 122. The application servers 118 are, in turn, shown to be coupled to one or more database servers 124 that facilitate access to one or more databases 126.

The marketplace applications 120 may provide a number of marketplace functions and services to users who access the networked system 102. The payment applications 122 may likewise provide a number of payment services and functions to users. The payment applications 122 may allow users to accumulate value (e.g., in a commercial currency, such as the U.S. dollar, or a proprietary currency, such as "points") in accounts, and then later to redeem the accumulated value for products (e.g., goods or services) that are made available via the marketplace applications 120. While the marketplace and payment applications 120 and 122 are shown in FIG. 1 to both form part of the networked system 102, it will be appreciated that, in alternative embodiments, the payment applications 122 may form part of a payment service that is separate and distinct from the networked system 102.

Further, while the system 100 shown in FIG. 1 employs a client-server architecture, the embodiments are, of course, not limited to such an architecture, and could equally well find application in a distributed, or peer-to-peer, architecture system, for example. The various marketplace and payment applications 120 and 122 could also be implemented as standalone software programs, which do not necessarily have networking capabilities.

The web client 106 accesses the various marketplace and payment applications 120 and 122 via the web interface supported by the web server 116. Similarly, the programmatic client 108 accesses the various services and functions provided by the marketplace and payment applications 120 and 122 via the programmatic interface provided by the API server 114. The programmatic client 108 may, for example, be a seller application (e.g., the TurboLister application developed by eBay Inc., of San Jose, Calif.) to enable sellers to author and manage listings on the networked system 102 in an off-line manner, and to perform batch-mode communications between the programmatic client 108 and the networked system 102.

FIG. 1 also illustrates a third party application 128, executing on a third party server machine 130, as having programmatic access to the networked system 102 via the programmatic interface provided by the API server 114. For example, the third party application 128 may, utilizing information retrieved from the networked system 102, support one or more features or functions on a website hosted by the third party. The third party website may, for example, provide one or more promotional, marketplace, or payment functions that are supported by the relevant applications of the networked system 102.

Figure 2:
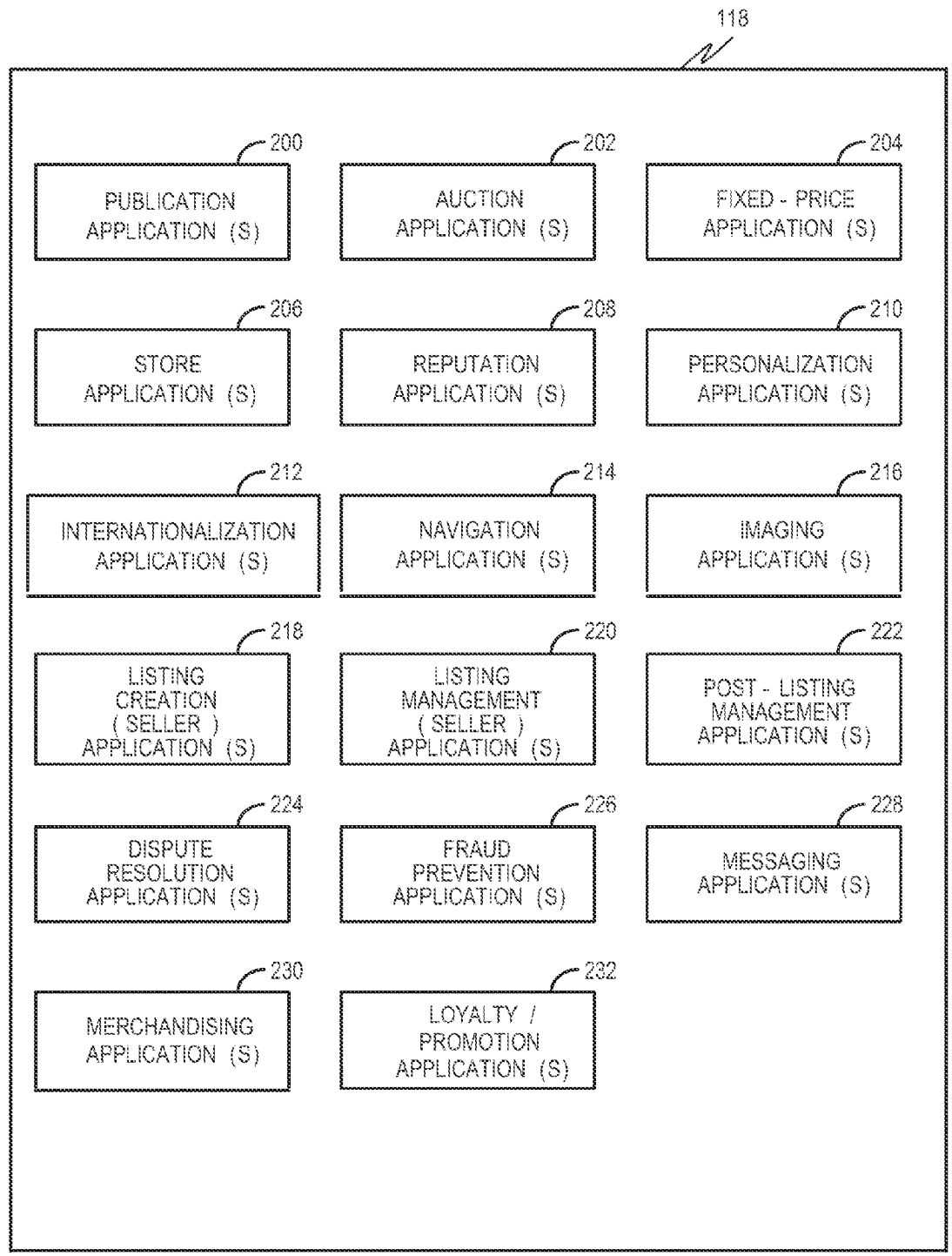
FIG. 2 is a block diagram illustrating marketplace and payment applications that, in one example embodiment, are provided as part of application server(s) in the networked system.

FIG. 2 is a block diagram illustrating marketplace and payment applications 120 and 122 that, in one example embodiment, are provided as part of application server(s) 118 in the networked system 102. The applications 120 and 122 may be hosted on dedicated or shared server machines (not shown) that are communicatively coupled to enable communications between server machines. The applications 120 and 122 themselves are communicatively coupled (e.g., via appropriate interfaces) to each other and to various data sources, so as to allow information to be passed between the applications 120 and 122 or so as to allow the applications 120 and 122 to share and access common data. The applications 120 and 122 may furthermore access one or more databases 126 via the database servers 124.

The networked system 102 may provide a number of publishing, listing, and price-setting mechanisms whereby a seller may list (or publish information concerning) goods or services for sale, a buyer can express interest in or indicate a desire to purchase such goods or services, and a price can be set for a transaction pertaining to the goods or services. To this end, the marketplace and payment applications 120 and 122 are shown to include at least one publication application 200 and one or more auction applications 202, which support auction-format listing and price setting mechanisms (e.g., English, Dutch, Vickrey, Chinese, Double, Reverse auctions, etc.). The various auction applications 202 may also provide a number of features in support of such auction-format listings, such as a reserve price feature whereby a seller may specify a reserve price in connection with a listing and a proxy-bidding feature whereby a bidder may invoke automated proxy bidding.

A number of fixed-price applications 204 support fixed-price listing formats (e.g., the traditional classified advertisement-type listing or a catalogue listing) and buyout-type listings. Specifically, buyout-type listings (e.g., including the Buy-It-Now (BIN) technology developed by eBay Inc., of San Jose, Calif.) may be offered in conjunction with auction-format listings, and allow a buyer to purchase goods or services, which are also being offered for sale via an auction, for a fixed-price that is typically higher than the starting price of the auction.

Store applications 206 allow a seller to group listings within a "virtual" store, which may be branded and otherwise personalized by and for the seller. Such a virtual store may also offer promotions, incentives, and features that are specific and personalized to a relevant seller.

Reputation applications 208 allow users who transact, utilizing the networked system 102, to establish, build, and maintain reputations, which may be made available and published to potential trading partners. Consider that where, for example, the networked system 102 supports person-to-person trading, users may otherwise have no history or other reference information whereby the trustworthiness and credibility of potential trading partners may be assessed. The reputation applications 208 allow a user (for example, through feedback provided by other transaction partners) to establish a reputation within the networked system 102 over time. Other potential trading partners may then reference such a reputation for the purposes of assessing credibility and trustworthiness.

Personalization applications 210 allow users of the networked system 102 to personalize various aspects of their interactions with the networked system 102. For example a user may, utilizing an appropriate personalization application 210, create a personalized reference page at which information regarding transactions to which the user is (or has been) a party may be viewed. Further, a personalization application 210 may enable a user to personalize listings and other aspects of their interactions with the networked system 102 and other parties.

The networked system 102 may support a number of marketplaces that are customized, for example, for specific geographic regions. A version of the networked system 102 may be customized for the United Kingdom, whereas another version of the networked system 102 may be customized for the United States. Each of these versions may operate as an independent marketplace or may be customized (or internationalized) presentations of a common underlying marketplace. The networked system 102 may accordingly include a number of internationalization applications 212 that customize information (and/or the presentation of information by the networked system 102) according to predetermined criteria (e.g., geographic, demographic or marketplace criteria). For example, the internationalization applications 212 may be used to support the customization of information for a number of regional websites that are operated by the networked system 102 and that are accessible via respective web servers 116.

Navigation of the networked system 102 may be facilitated by one or more navigation applications 214. For example, a search application (as an example of a navigation application 214) may enable key word searches of listings published via the networked system 102. A browse application may allow users to browse various category, catalogue, or inventory data structures according to which listings may be classified within the networked system 102. Various other navigation applications 214 may be provided to supplement the search and browsing applications.

In order to make listings available via the networked system 102 as visually informing and attractive as possible, the applications 120 and 122 may include one or more imaging applications 216, which users may utilize to upload images for inclusion within listings. An imaging application 216 also operates to incorporate images within viewed listings. The imaging applications 216 may also support one or more promotional features, such as image galleries that are presented to potential buyers. For example, sellers may pay an additional fee to have an image included within a gallery of images for promoted items.

Listing creation applications 218 allow sellers to conveniently author listings pertaining to goods or services that they wish to transact via the networked system 102, and listing management applications 220 allow sellers to manage such listings. Specifically, where a particular seller has authored and/or published a large number of listings, the management of such listings may present a challenge. The listing management applications 220 provide a number of features (e.g., auto-relisting, inventory level monitors, etc.) to assist the seller in managing such listings. One or more post-listing management applications 222 also assist sellers with a number of activities that typically occur post-listing. For example, upon completion of an auction facilitated by one or more auction applications 202, a seller may wish to leave feedback regarding a particular buyer. To this end, a post-listing management application 222 may provide an interface to one or more reputation applications 208, so as to allow the seller conveniently to provide feedback regarding multiple buyers to the reputation applications 208.

Dispute resolution applications 224 provide mechanisms whereby disputes arising between transacting parties may be resolved. For example, the dispute resolution applications 224 may provide guided procedures whereby the parties are guided through a number of steps in an attempt to settle a dispute. In the event that the dispute cannot be settled via the guided procedures, the dispute may be escalated to a third party mediator or arbitrator.

A number of fraud prevention applications 226 implement fraud detection and prevention mechanisms to reduce the occurrence of fraud within the networked system 102.

Messaging applications 228 are responsible for the generation and delivery of messages to users of the networked system 102 (such as, for example, messages advising users regarding the status of listings at the networked system 102 (e.g., providing "outbid" notices to bidders during an auction process or to provide promotional and merchandising information to users)). Respective messaging applications 228 may utilize any one of a number of message delivery networks and platforms to deliver messages to users. For example, messaging applications 228 may deliver electronic mail (e-mail), instant message (IM), Short Message Service (SMS), text, facsimile, or voice (e.g., Voice over IP (VoIP)) messages via the wired (e.g., the Internet), plain old telephone service (POTS), or wireless (e.g., mobile, cellular, WiFi, WiMAX) networks 104.

Merchandising applications 230 support various merchandising functions that are made available to sellers to enable sellers to increase sales via the networked system 102. The merchandising applications 230 also operate the various merchandising features that may be invoked by sellers, and may monitor and track the success of merchandising strategies employed by sellers.

The networked system 102 itself, or one or more parties that transact via the networked system 102, may operate loyalty programs that are supported by one or more loyalty/promotions applications 232. For example, a buyer may earn loyalty or promotion points for each transaction established and/or concluded with a particular seller, and be offered a reward for which accumulated loyalty points can be redeemed.

Figure 3:
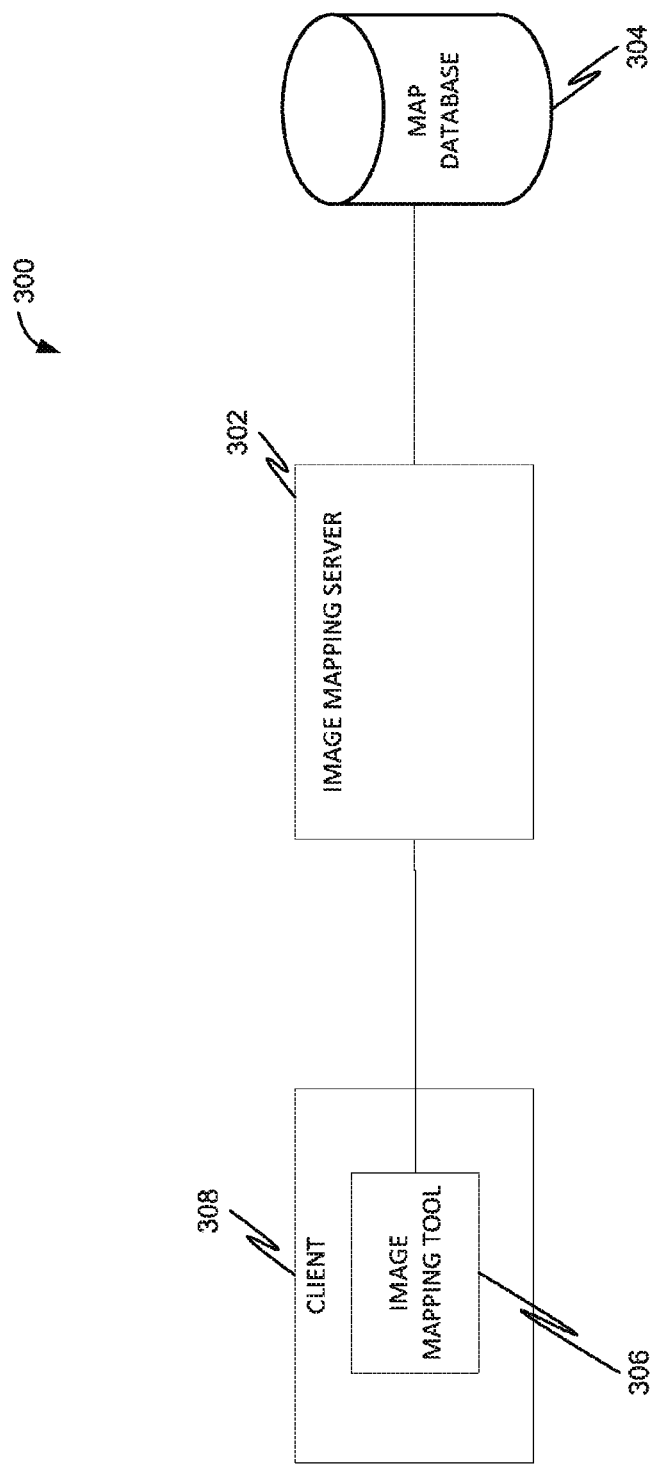
FIG. 3 is a block diagram illustrating a system for three dimensional image mapping in accordance with an example embodiment.

FIG. 3 is a block diagram illustrating a system 300 for three dimensional image mapping in accordance with an example embodiment. Here, an image mapping server 302 may retrieve a map from a map database 304. A user may then utilize the map, via an image mapping tool 306 on a client device 308, to interact with the image mapping server 302 to perform various functions that aid in the mapping of three dimensional objects on the map.

It should be noted that the image mapping tool 306 may be implemented in a number of different ways. In an example embodiment, the image mapping tool 306 comprises one or more web pages being executed by a browser on the client device 308. In another example embodiment, the image mapping tool 306 is contained within an application, such as an ecommerce application that allows a user to purchaser and/or bid on items and services, executing on the client device 308. Additionally, in some example embodiments the image mapping tool 306 actually operates on the image mapping server 302 and is accessed by the client device 308 over a network, such as the Internet.

In an example embodiment, the image mapping tool 306 shows the consumer a picture of their house from two or more different views (e.g. a straight down view, and a view that is from the south at a 45 degree angle, obtained from the map database 304).

The consumer can then trace the sections of their roof on the first view e.g. by marking corners and other obvious features on the roof. The consumer is then shown the tracing that they had made on the first view overlaid on the second view. The tracing undergoes a geometric transformation (i.e. the points are shifted) to represent the difference in angle that the two photographs were taken from.

The consumer then drags the tracing to be on top of their house. The consumer is able to drag the points on the tracing so that all points in the tracing match their corresponding points on this second view.

The tracing on the first view provided the position of each point in two dimensions. Dragging the points to the correct position in the second view provides the value for the points for that third dimension.

If the first view is from the top, tracing on the first view provides the X and Y value for each point. Dragging points to the correct position on the second view provides Z. If the first view is not from the top, tracing on the first view provides the X and Y value for each point relative to the angle of the first view and the second view provides Z relative to the angle of the first view. These points can easily be transformed to the X, Y, and Z frame of the surface of the earth by those familiar with the art. Additional views may be shown. These can help determine positions of points that are obscured (by a tree for example) on the first two images.

Aerial and satellite photographs are often taken at a nominal 45 degree angle. These images, unfortunately, typically are not at exactly 45 degrees—different portions of the image are at different angles, for example varying from 43 degrees to 47 degrees.

By allowing the user to drag points in the tracing to match the image in multiple views, a system of equations may be set up where the actual angle of the photograph is solved for (using multiple equations with multiple unknowns). This increases the accuracy of the three dimensional model that is created.

Once the positions of all of the points are input, roof angle, azimuth, size and shape can all be determined mathematically. This can be performed by determining mathematically the azimuth and tilt of the planes that are defined by the points that were input.

Aerial and satellite photos are commonly available with a nominally straight-down camera angle, and camera angles that are tilted nominally 45 degrees in the North, East, South, and West directions. These are not however their true directions, with camera angles often varying widely, e.g. from 35 to 55 degree angles. The true camera angle can be taken into account in the automatic determination.

In one embodiment, the camera angles are calibrated through an explicit process. In this embodiment, three non-collinear points that are at the same height are identified by the user from two or more camera angles. Because the height from the ground is known to be identical for these three points, camera angle can be calculated using the following process:

Three calibration points are identified by the consumer in the top down view ($P_{A1}$, $P_{A2}$, $P_{A3}$). These three calibration points are moved to the correct location on the roofline by the consumer on the 45 degree view ($P_{B1}$, $P_{B2}$, $P_{B3}$). The calibration algorithm iterates through, for example, a ±10 degree span on each of the camera angles (pan, tilt, roll).

Each set of camera angles is applied to $P_{A1}$, $P_{A2}$, $P_{A2}$ and compared to $P_{B1}$, $P_{B2}$, $P_{B3}$. The angles where the points are the closest are used for the calibrated camera. In an example embodiment, the camera angles are calculated as follows:

Assuming that there are four non-collinear points ($x_1$, $y_1$, $z_1$) through ($x_4$, $y_4$, $z_4$) viewed through two cameras, A and B, the following equations apply:

For camera A: Projected $x_n = \alpha*(\cos(\text{tilt}_{xzA})*\text{Actual } x_n + \sin(\text{tilt}_{xzA})*\text{Actual } z_n)$ For camera A: Projected $y_n = \alpha*(\cos(\text{tilt}_{yzA})*\text{Actual } y_n + \sin(\text{tilt}_{yzA})*\text{Actual } z_n)$ For camera B: Projected $x_n = \beta*(\cos(\text{tilt}_{xzB})*\text{Actual } x_n + \sin(\text{tilt}_{xzB})*\text{Actual } z_n)$ For camera B: Projected $y_n = \beta*(\cos(\text{tilt}_{yzB})*\text{Actual } y_n + \sin(\text{tilt}_{yzB})*\text{Actual } z_n)$ Where ($x_n$, $y_n$, $z_n$) are valid for ($x_1$, $y_1$, $z_1$) through ($x_4$, $y_4$, $z_4$)

$\alpha$ is the zoom of camera A $\beta$ is the zoom of camera B $\text{tilt}_{xzA}$ is the tilt of camera A in the $x_z$ direction $\text{tilt}_{yzA}$ is the tilt of camera A in the $y_z$ direction $\text{tilt}_{xzB}$ is the tilt of camera B in the $x_z$ direction $\text{tilt}_{yzB}$ is the tilt of camera B in the $y_z$ direction If $\alpha=1$ is normalized, point ($x_1$, $y_1$, $z_1$) is normalized to (0,0,0), and both $\text{tilt}_{xzA}$ and $\text{tilt}_{yzA}$ are normalized to (0,0), the following equations are derived:

For camera A: Projected $x_n$ = Actual $x_n$

For camera A: Projected $y_n$ = Actual $y_n$

For camera B: Projected $x_1 = 0$

For camera B: Projected $y_1 = 0$

For camera B: Projected $x_n = 0*(\cos(\text{tilt}_{xzB})*\text{Projected } x_n \text{ in cam A} + \sin(\text{tilt}_{xzB})*\text{Actual } z_n)$ For camera B: Projected $y_n = \beta*(\cos(\text{tilt}_{yzB})*\text{Projected } y_n \text{ in cam A} + \sin(\text{tilt}_{yzB})*\text{Actual } z_n)$ Where $(x_n, y_n, z_n)$ are valid for $(x_1, y_1, z_1)$ through $(x_4, y_4, z_4)$ $\beta$ is the zoom of camera B $tilt_{xzB}$ is the tilt of camera B in the $x_z$ direction relative to camera A $tilt_{yzB}$ is the tilt of camera B in the $y_z$ direction relative to camera A Since projected $x_n$ and projected $y_n$ are provided by the user from both camera angles, 6 equations with 6 unknowns are present, which can be solved for all variables using traditional techniques.

The technique and the mathematics described above can be extended to an indefinite number of cameras at different angles as long as each point's projected position is marked by the user in at least two different cameras of different angles.

In an example embodiment, the user can mark points as certain or uncertain. Points would be marked as uncertain if the object that they refer to (for example a particular corner of the roof) is obscured, for example by a tree. Points that are marked uncertain would not be included in the set of equations used to solve for position of the point and camera angles.

Solar energy collection is affected by obstructions to sunlight, such as trees, chimneys, other buildings, etc. Determining the position of these obstructions as a 3D model is important for determining potential energy output of a given potential location for a solar panel, as it provides the information necessary to determine which portions of the day the given location is shaded. Since energy collection varies by time of day, this is critical information.

In an example embodiment, the user marks the location of the obstructions on each view, just as they did on the roof itself. The same techniques as were used on the house to determine the 3D model are used on this new item, the 3D model of which is used to model shading.

In an example embodiment, the user marks a simple shape (such as an ellipse) that acts as a bounding area for the obstruction. This is particularly useful for an obstruction that itself is indistinct, such as a tree. This bounding shape is changed on each view. In an example embodiment this set of data is used to generate 3D data that is used to generate shading data.

In an example embodiment, the user marks a shape from the straight down view (such as a circle), and then drags a shape (such as a cylinder) to the height of the obstruction in another view, enclosing the obstruction with this simple shape. This process acts as a visual method that replaces computation of the obstruction at multiple angles. For this to be possible, the exact angle of each camera must be calculated, as disclosed earlier in this disclosure.

In an example embodiment the aforementioned set of data is used as a guide as to time of day when a given location would be shaded, i.e. if the southwest view shows an obstruction in a given location this location will be shaded when the sun is coming from the southwest, so the energy calculation for that spot would not include the energy produced during times that the sun is approximately southwest. Additionally in this embodiment, interpolation may be used to approximate shading for the sun when the sun is in locations that don't have an image from that direction included in the data set.

Another problem that could exist is lack of accurate calibration data on the true distance represented by each pixel on the image. In an example embodiment, the user is asked to provide the measurement of a single feature, such as the width of a driveway. These points and the distance between them are marked on the map by the user and are used to calibrate the entire map.

In an example embodiment, the user is asked to mark an element that has a known dimension, such as the tab to tab distance of a three-tab shingle. This is used to calibrate the image.

After determining the 3D shape of the roof and the obstructions, determination of best position of solar panels may be made.

Once a 3D model of the roof and shading is created, a map of solar energy potential production may be created using techniques that are known to those skilled in the art. Likewise the 3D model of the roof may be used to determine potential positions and orientations of groups of solar panels that would physically fit on the roof In an example embodiment, a cost is generated for each potential solar panel configuration. This cost may include monetary costs, such as the cost of the solar panels, electronics, mounting hardware, and wiring, but may also include less tangible costs, such as a percentage premium for placing solar panels on a side of the building where they are less aesthetically desirable.

In an example embodiment, the cost value of each potential layout is divided by the expected energy produced by that layout to generate a cost per unit of electricity generated.

In an example embodiment, several optimum solutions are determined and presented as choices to the user. One optimum solution could be the configuration which generates the most energy, without regard to cost. Another optimal solution might be a configuration where the unit cost of electricity generated is lowest. Another optimal solution might be lowest cost of electricity while placing panels on only a single roof surface. Another optimal solution might be the smallest solar system that is economically viable (i.e. lowers the user's electricity bill by more than the amount of a monthly lease payment).

In an example embodiment, each section of roof is displayed with a rectangular grid overlaid, the size of each rectangle equivalent to the size of a solar panel. Cells of the grid which don't intersect a keep-out area and are fully bounded by the outline of the section of roof are displayed in a way that distinguishes them from other grid cells, such as in a different line thickness. A user interface is provided that allows the user to move the grid on a fine basis, allowing the user to test solar array position adjustments for how many solar panels and which positions would be populated on the roof.

In an example embodiment, building code rules are overlaid as keep-out areas. These building code rules may be things like distance from each edge of the roof that the solar panels cannot be within.

In an example embodiment, these building code rules are crowd-sourced, with a table of rules that vary by jurisdiction being kept in a database that can be updated by users of sufficient privilege or reputation (such as solar installers) for use by the entire community.

In an example embodiment, groups of contiguous solar panels are displayed for the users, with the user able to select which group or groups that they wish to include based on a combination of aesthetic and technical details as the user sees fit.

In an example embodiment, the above techniques may also be used for other applications that involve extracting a 3D model from a set of photographs.

In an example embodiment, the user takes multiple photographs of a room such as a kitchen or closet. They mark off points on the photograph as disclosed herein, and create a 3D model that can be used to position virtual cabinets or built-ins.

The following screen captures illustrate an example embodiment for the above-described tool.

Figure 4:
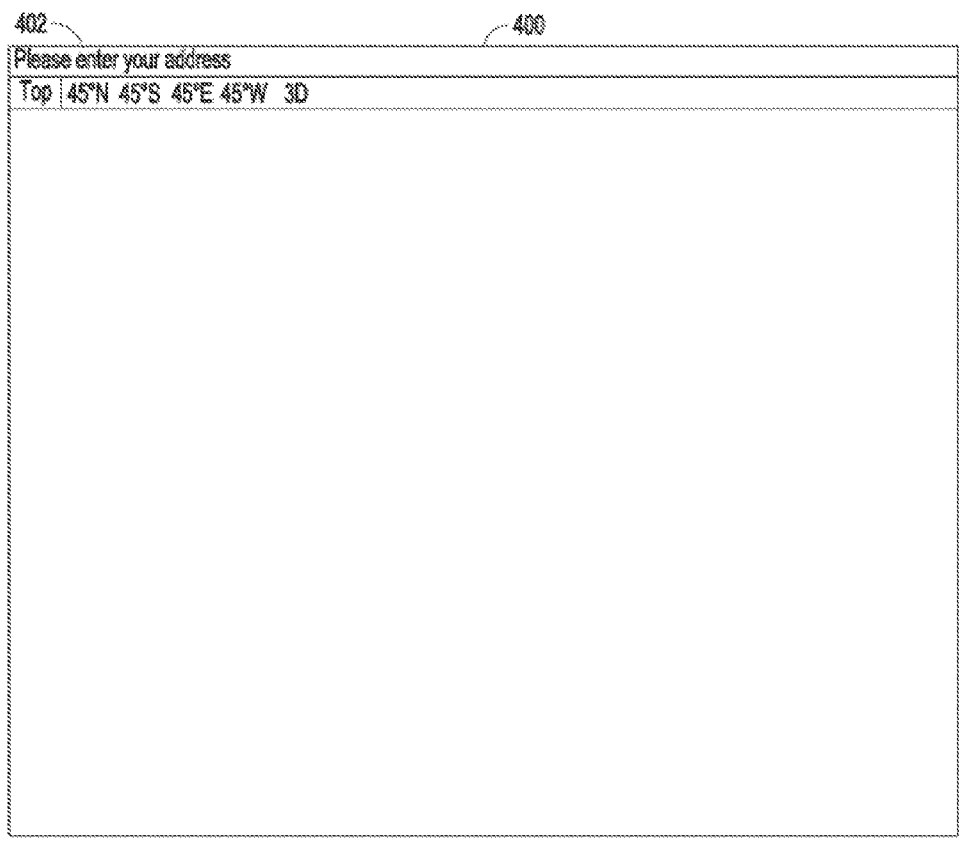
FIG. 4 is a screen capture illustrating a user interface where the user may enter their address in box 402 in accordance with an example embodiment.
Figure 5:
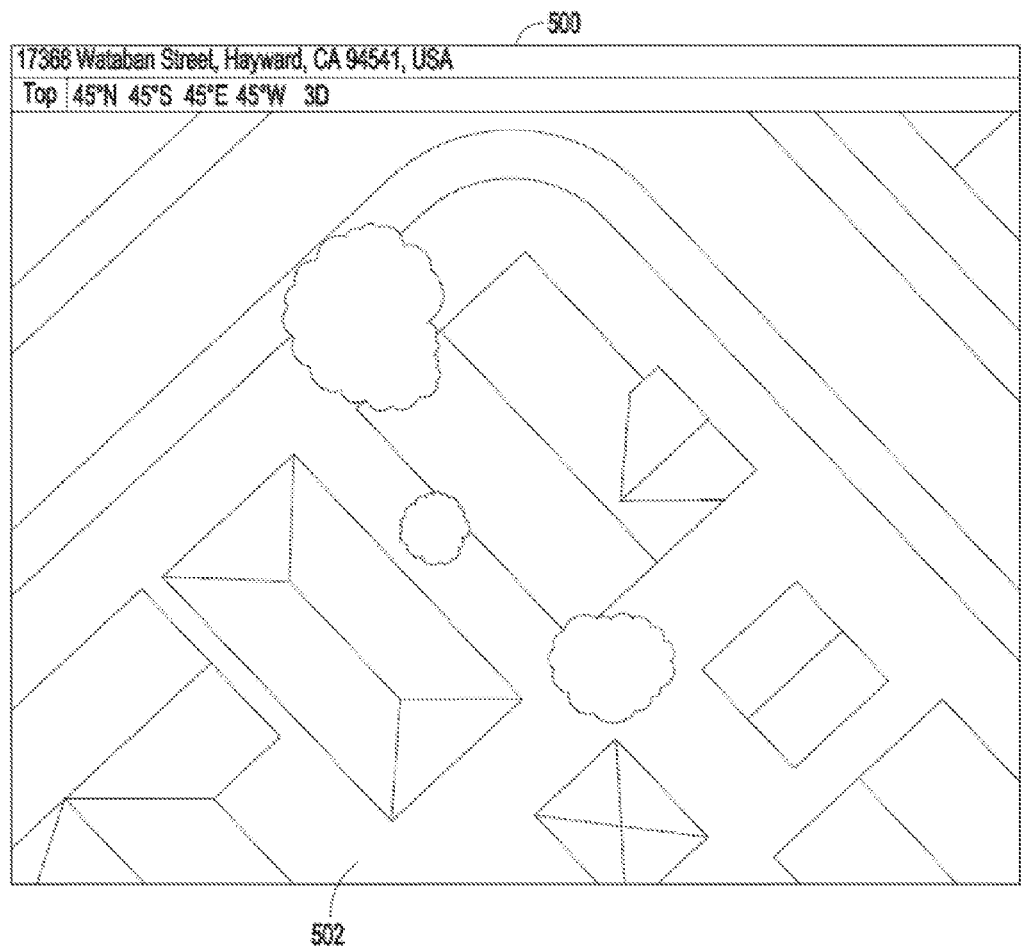
FIG. 5 is a screen capture illustrating a user interface where a satellite map has been retrieved and displayed.

FIG. 4 is a screen capture illustrating a user interface 400 where the user may enter their address in box 402 in accordance with an example embodiment. The act of entering the address causes the system to retrieve a satellite image of the entered address. FIG. 5 is a screen capture illustrating a user interface 500 where a satellite map has been retrieved and displayed. The map 502 is displayed, with the exact house 504 corresponding to the address centered in the user interface 500. In this screen capture, a roofline may be outlined in the tool by the user.

Figure 6:
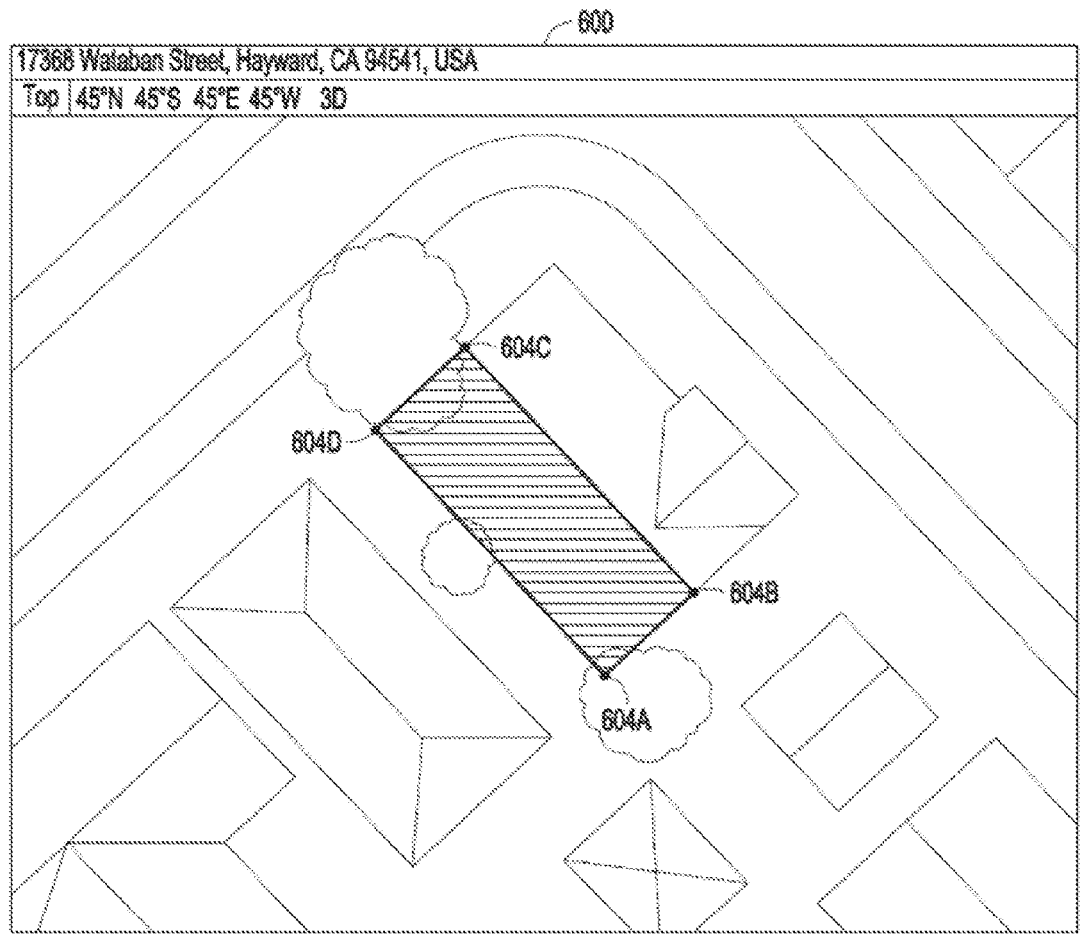
FIG. 6 is a screen capture illustrating a user interface where a roofline has been drawn.

FIG. 6 is a screen capture illustrating a user interface 600 where a roofline 602 has been drawn. Here, the user may draw the roofline 602 by clicking and dragging various points, such as points 604A, 604B, 604C, 604D outlining the edge of the roofline, although in some example embodiments some or all of this may be performed automatically.

Figure 7:
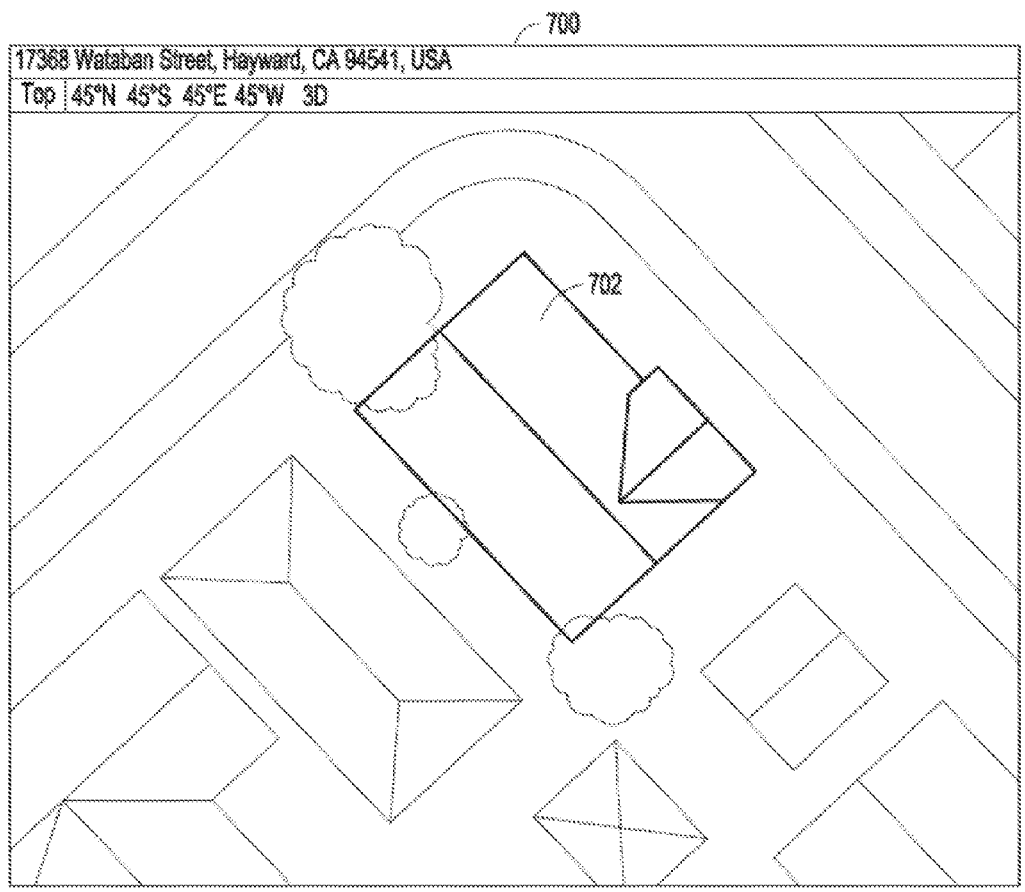
FIG. 7 is a screen capture illustrating a user interface where a second roofline has been drawn.

Most houses will contain more than one roofline. In such cases, the system may provide additional opportunities for the user to input additional rooflines. FIG. 7 is a screen capture illustrating a user interface 700 where a second roofline 702 has been drawn.

In another example embodiment, the tool permits the user to define keep out areas. These keep out areas define areas of the roofline where solar panels should not be attached. Examples of such areas are heavily shaded areas (such as areas underneath trees) and areas where elements of the house (vent stacks, antennas, satellite dishes, etc.) extend onto the roof.

Figure 8:
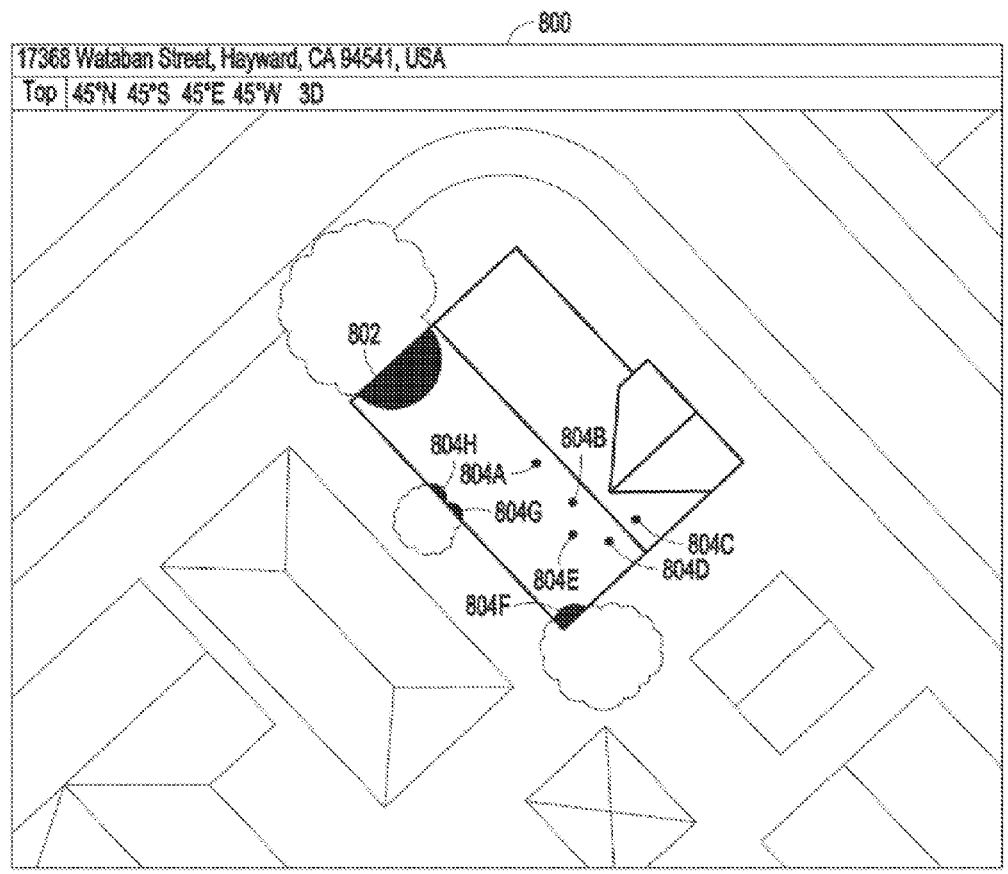
FIG. 8 is a screen capture illustrating a user interface permitting the defining of keep out areas.

FIG. 8 is a screen capture illustrating a user interface 800 permitting the defining of keep out areas. Here, a keep out area 802 has been defined that is underneath a tree. Additional keep out areas 804A-804H have been defined that reflect other obstacles.

It should be noted that while a tool for user definition of such keep out areas is described herein, embodiments are foreseen wherein the system automatically defines some or all of the keep-out areas, either with or without user approval of such definitions. For example, some of the techniques described herein could be used to automatically detect the height and orientation of trees adjacent to a house and map shadow patterns using sun position information over the course of a year to define a keep out area. Other similar techniques could be used to define additional keep-out areas.

Figure 9:
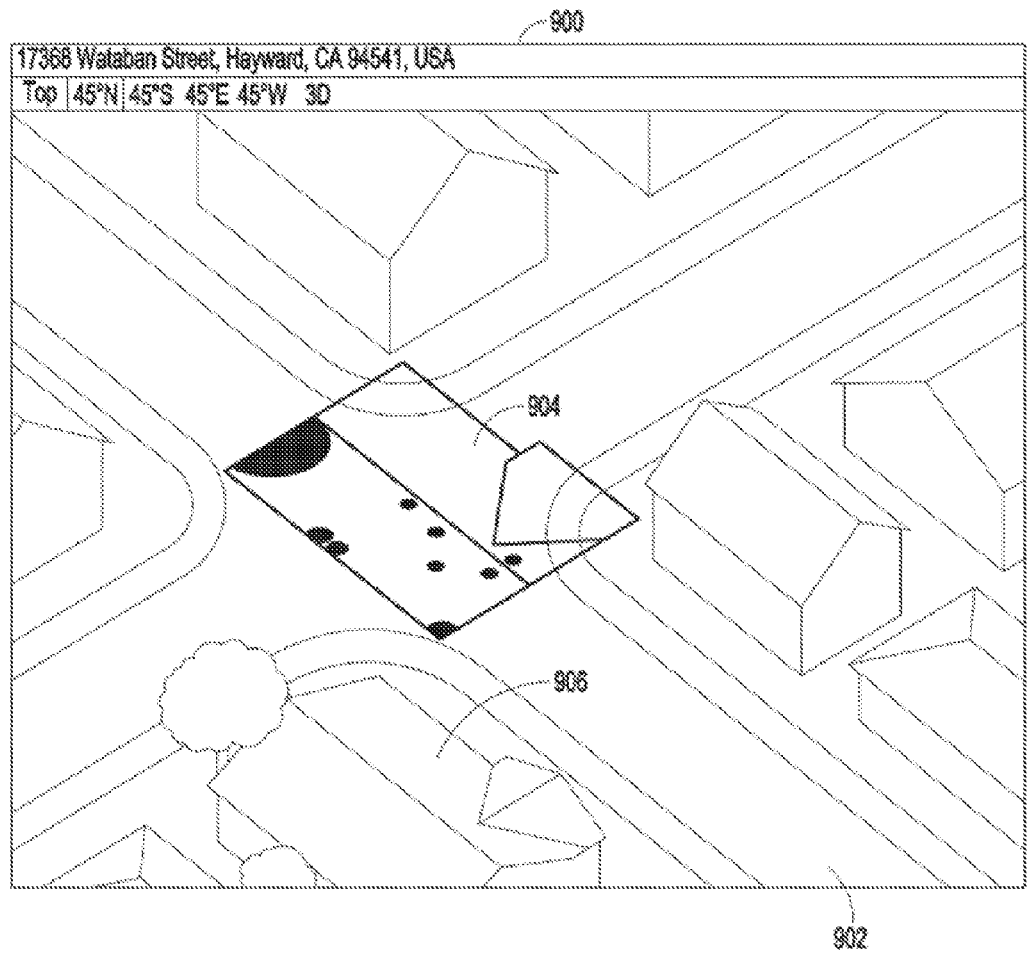
FIG. 9 is a screen capture illustrating a user interface where a second view has been presented, in accordance with an example embodiment.

Once the user has completed the roofline, including any keep out areas, for a first view, the system may proceed with presenting the user with a second view for the user to continue the definition of the rooflines in the second view. As described earlier, this allows the system to automatically calculate dimensions. FIG. 9 is a screen capture illustrating a user interface 900 where a second view has been presented, in accordance with an example embodiment. As can be seen, a satellite photo 902 from a different angle than the first view is now presented. Also notably, the mapping 904 the user had provided in the first view has been carried over to the second view. As also can be seen in this figure, the user's house 906 is offcenter from the mapping 904. The tool may allow the user to drag the satellite photo 902 to align the house 906 with the mapping 904.

Figure 10:
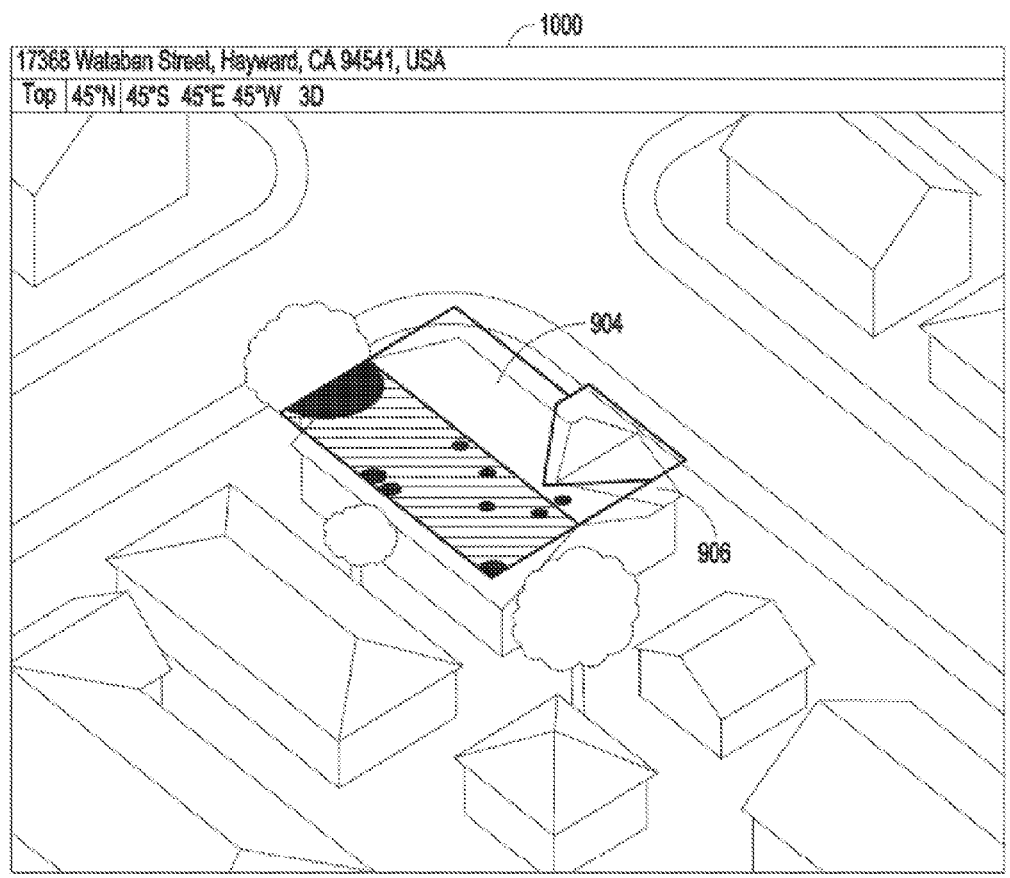
FIG. 10 is a screen capture illustrating a user interface after the user has aligned the house with the mapping, in accordance with an example embodiment.

FIG. 10 is a screen capture illustrating a user interface 1000 after the user has aligned the house 906 with the mapping 904, in accordance with an example embodiment. Notably, while the house 906 is now depicted as directly underneath the mapping 904, the mapping 904 does not line up perfectly with the rooflines in this satellite photo 902. As such, the user will need to adjust one or more calibration points to align the rooflines exactly with the mapping.

Figure 11:
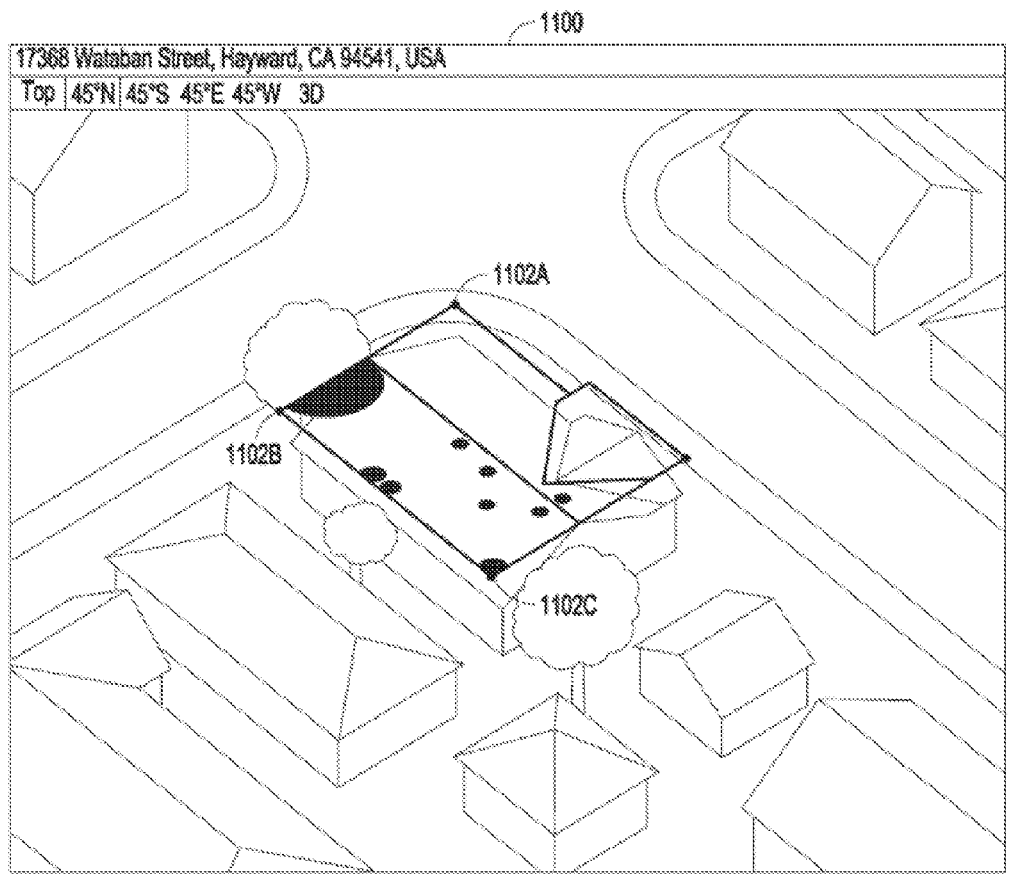
FIG. 11 is a screen capture illustrating a user interface with calibration points, in accordance with an example embodiment.
Figure 12:
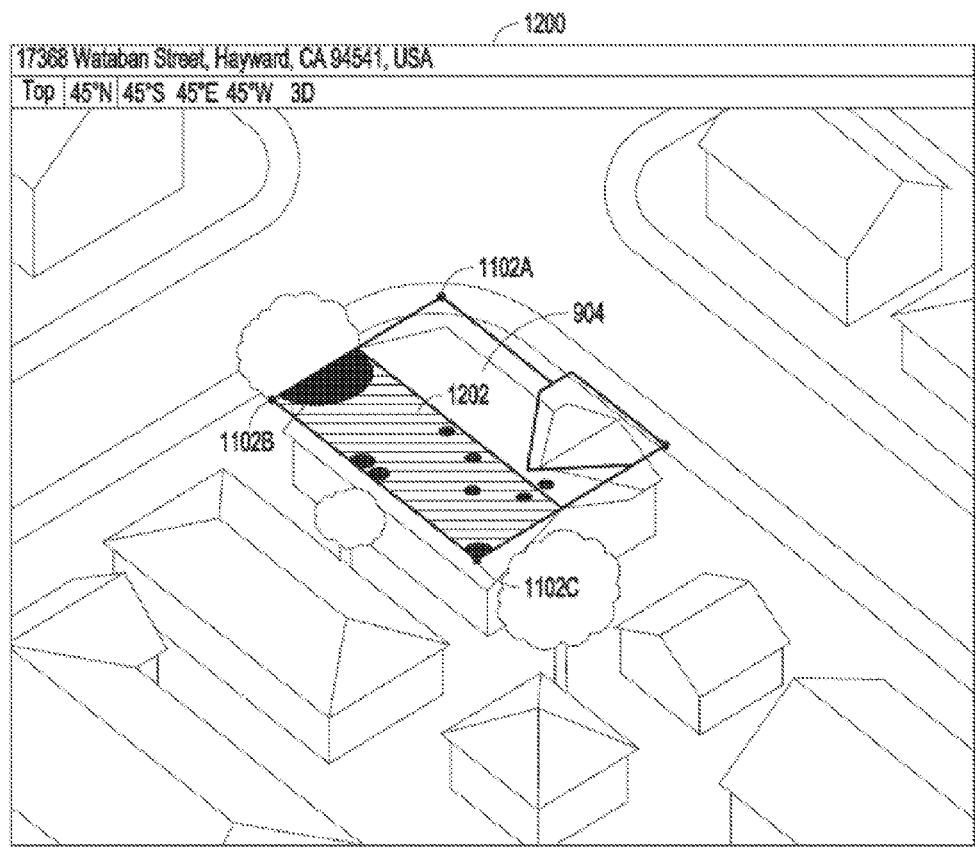
FIG. 12 is a screen capture illustrating a user interface where the user has selected a particular roofline, in accordance with an example embodiment.
Figure 13:
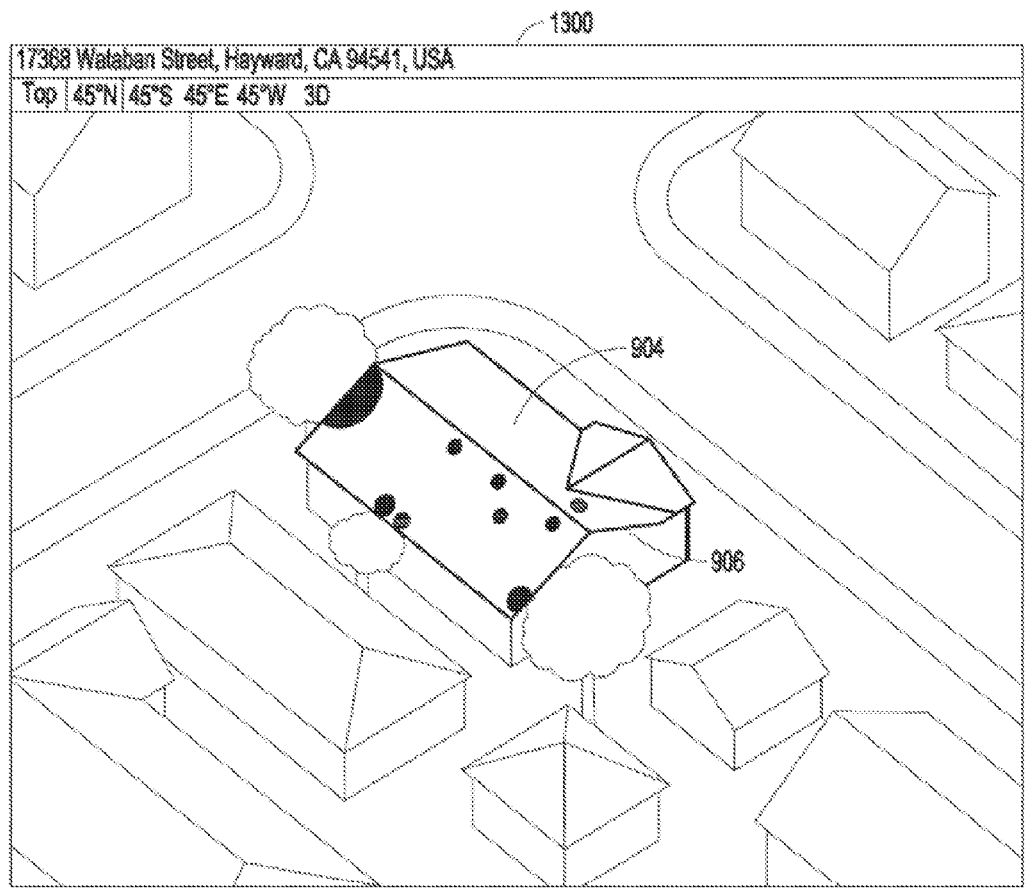
FIG. 13 is a screen capture illustrating a user interface where the user has adjusted all of the rooflines so that the mapping covers the roof of the house exactly, in accordance with an example embodiment.

FIG. 11 is a screen capture illustrating a user interface 1100 with calibration points 1102A-1102C, in accordance with an example embodiment. Here, calibration points 1102A-1102C have been highlighted by the tool. These calibration points 1102A-1102C allow the user to click and drag the mapping 904 to match the roofline exactly. The user may select which roofline is being modified by clicking on the roofline. FIG. 12 is a screen capture illustrating a user interface 1200 where the user has selected a particular roofline 1202, in accordance with an example embodiment. The user may then proceed to adjust the roofline using the calibration points 1102B, 1102C. Similar processes may then be performed on the other rooflines. FIG. 13 is a screen capture illustrating a user interface 1300 where the user has adjusted all of the rooflines so that the mapping 904 covers the roof of the house 906 exactly, in accordance with an example embodiment.

Figure 14:
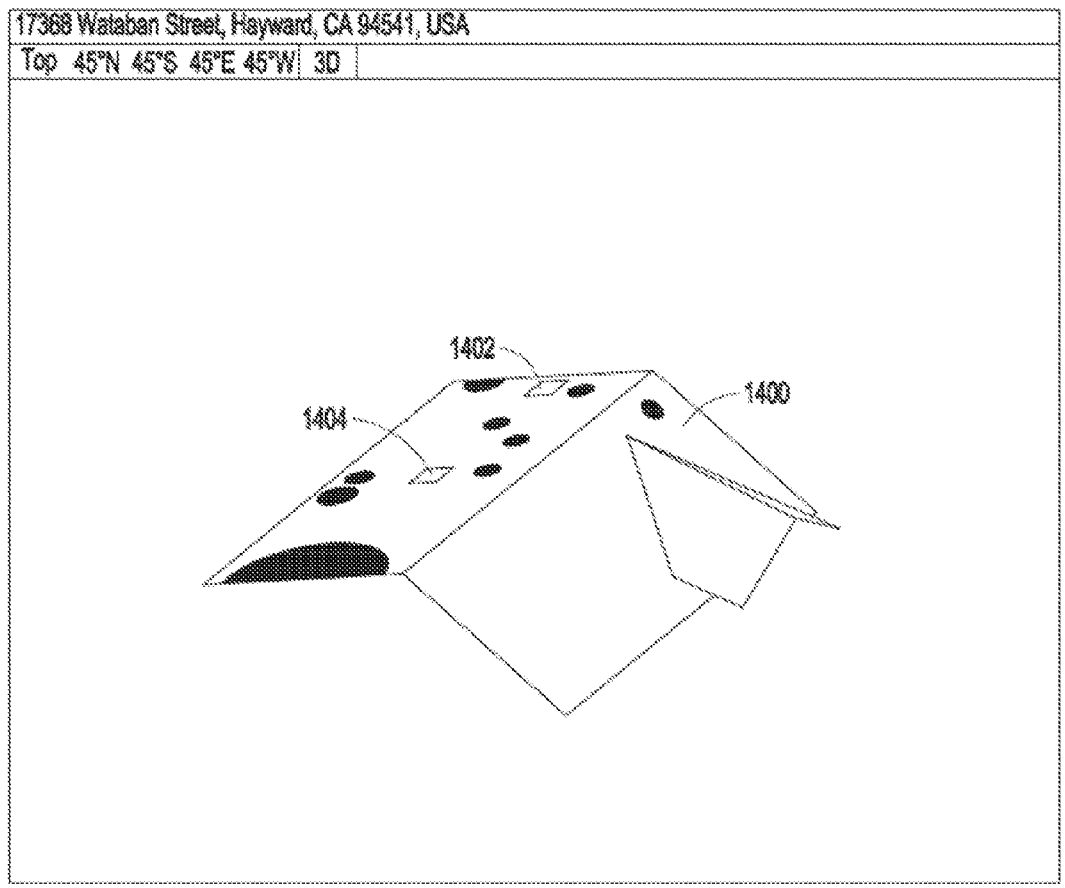
FIG. 14 is a screen capture illustrating a completed mapping in accordance with an example embodiment.

At this point, enough data has been gathered to calculate the appropriate dimensions and angles using the process described earlier. This results in a 3D mapping that includes dimensions, which can then be used for solar panel installation estimates (or any other purposes). FIG. 14 is a screen capture illustrating a completed mapping 1400 in accordance with an example embodiment. As can be seen, the mapping 1400 includes dimensions, such as dimension 1402, as well as angles, such as angle 1404.

Figure 15:
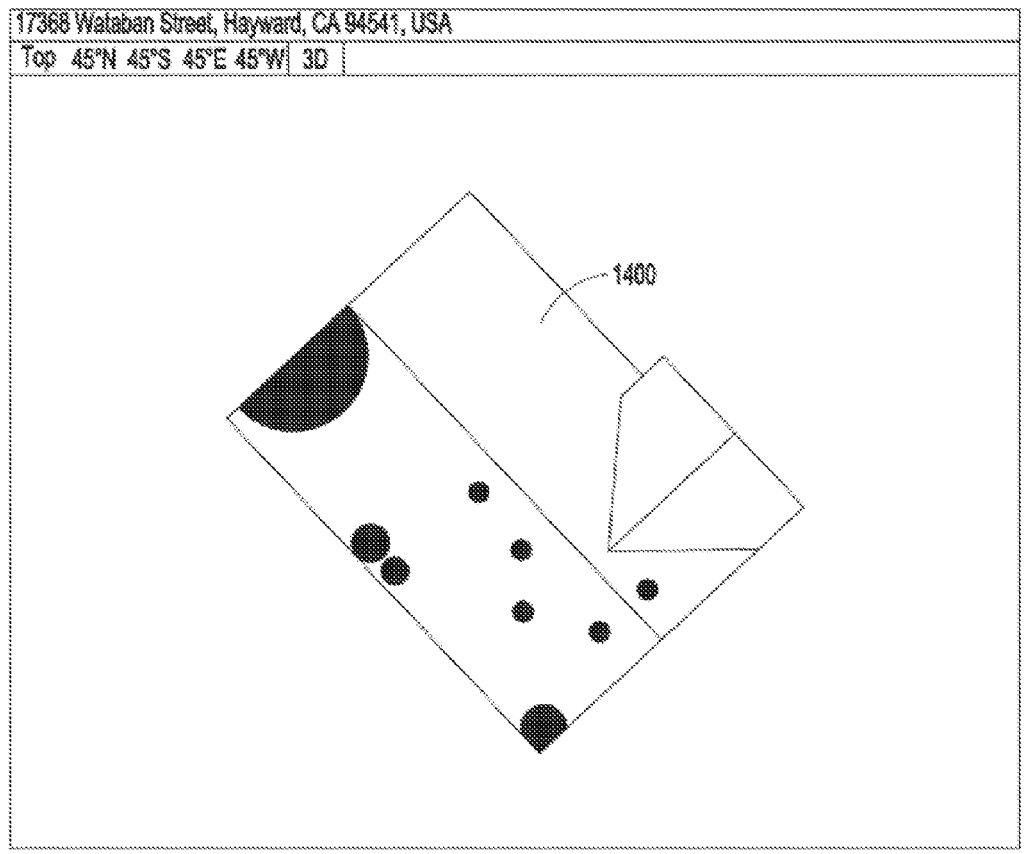
FIG. 15 is a screen capture illustrating another angle of the completed mapping in accordance with an example embodiment.

FIG. 15 is a screen capture illustrating another angle of the completed mapping 1400 in accordance with an example embodiment.

Figure 16:
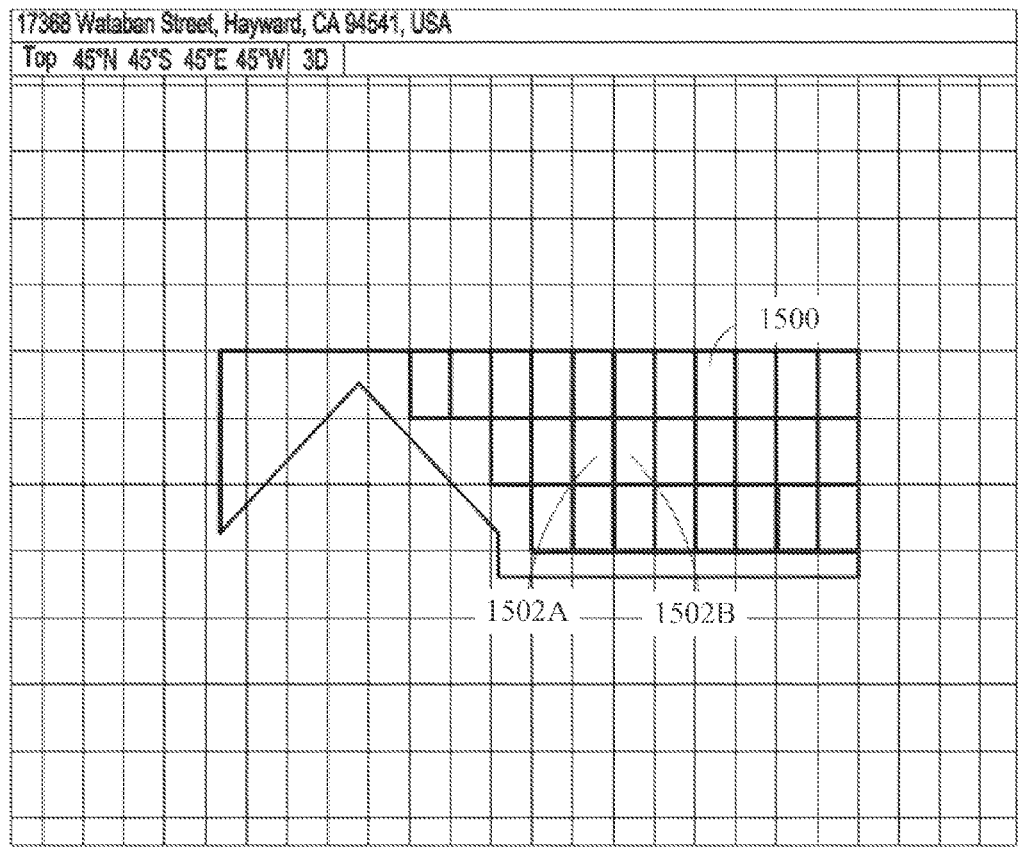
FIG. 16 is a screen capture illustrating a solar panel layout on mapping, in accordance with an example embodiment.

At this point, the mapping 1400 can be used for a number of different purposes. As described earlier, in some example embodiments the mapping 1400 will be used for solar panel installation layouts. These layouts can be provided with or without user intervention. For example, the system may use the mapping 1400 to automatically place an optimum solar panel layout on the roof. Alternatively, the user can lay out the solar panels manually. In some embodiments, some combination of the two is used, for example the system may suggest a layout which the user may edit. FIG. 16 is a screen capture illustrating a solar panel layout on mapping 1400, in accordance with an example embodiment. As can be seen, solar panels, such as panels 1502A and 1502B are laid out on one of the sides of the roof.

Figure 17:
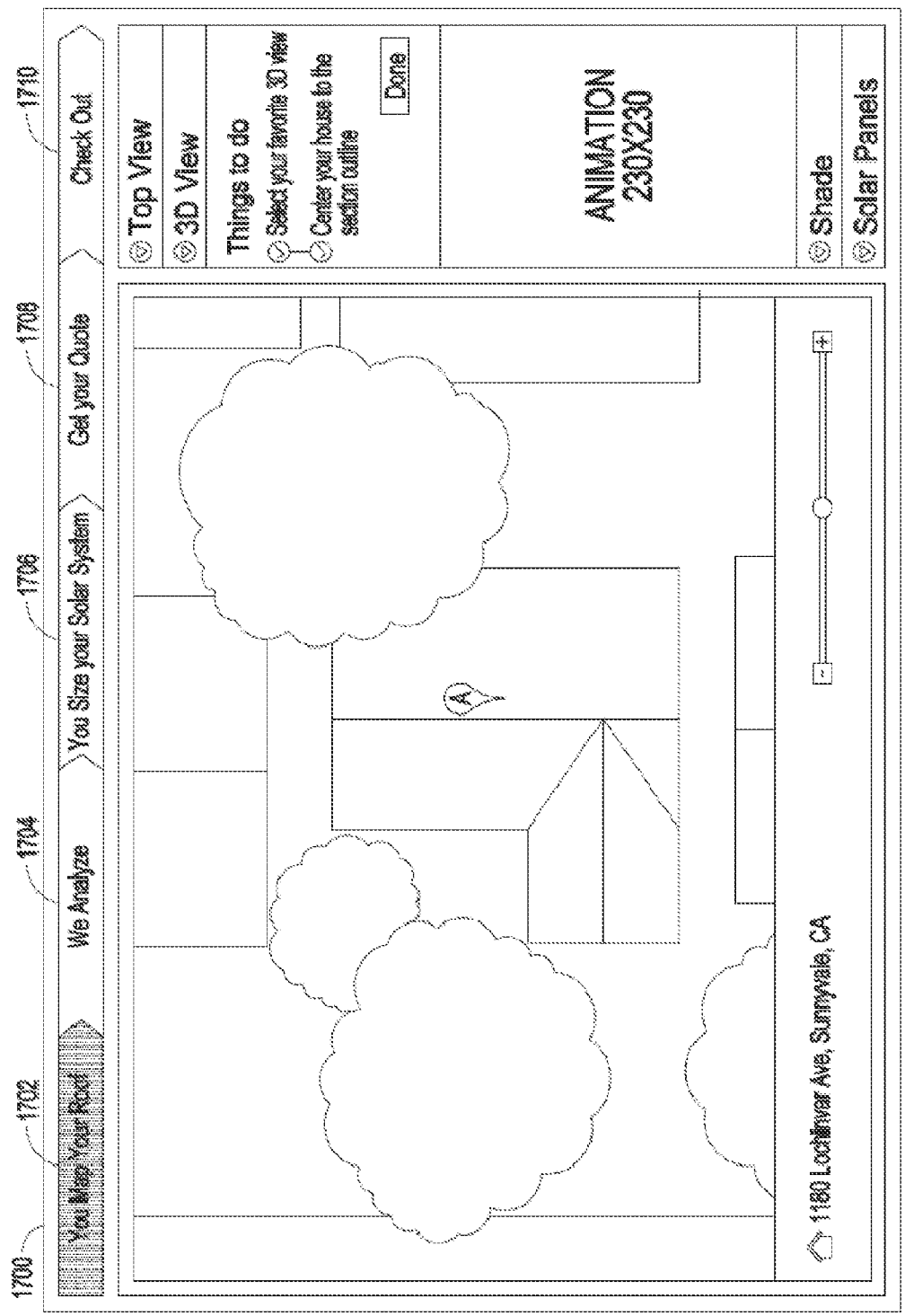
FIG. 17 is a screen capture illustrating a specialized user interface for solar panel installation mappings in an ecommerce service in accordance with an example embodiment.

In an example embodiment, the above-described tool may be integrated directly into an ecommerce service. In such a case, a specialized user interface may be provided. FIG. 17 is a screen capture illustrating a specialized user interface 1700 for solar panel installation mappings in an ecommerce service in accordance with an example embodiment. The specialized user interface 1700 may provide a wizard or other tool that guides the user through the steps of purchasing a solar system through the ecommerce site. As can be seen, there are generally five steps in this process, including mapping the roof 1702, analyzing the mapping 1704, sizing the solar system based on the mapping 1706, getting a price quote 1708, and checking out 1710 The user interface 1700 at this stage is at the first step, mapping the roof 1702.

Figure 18:
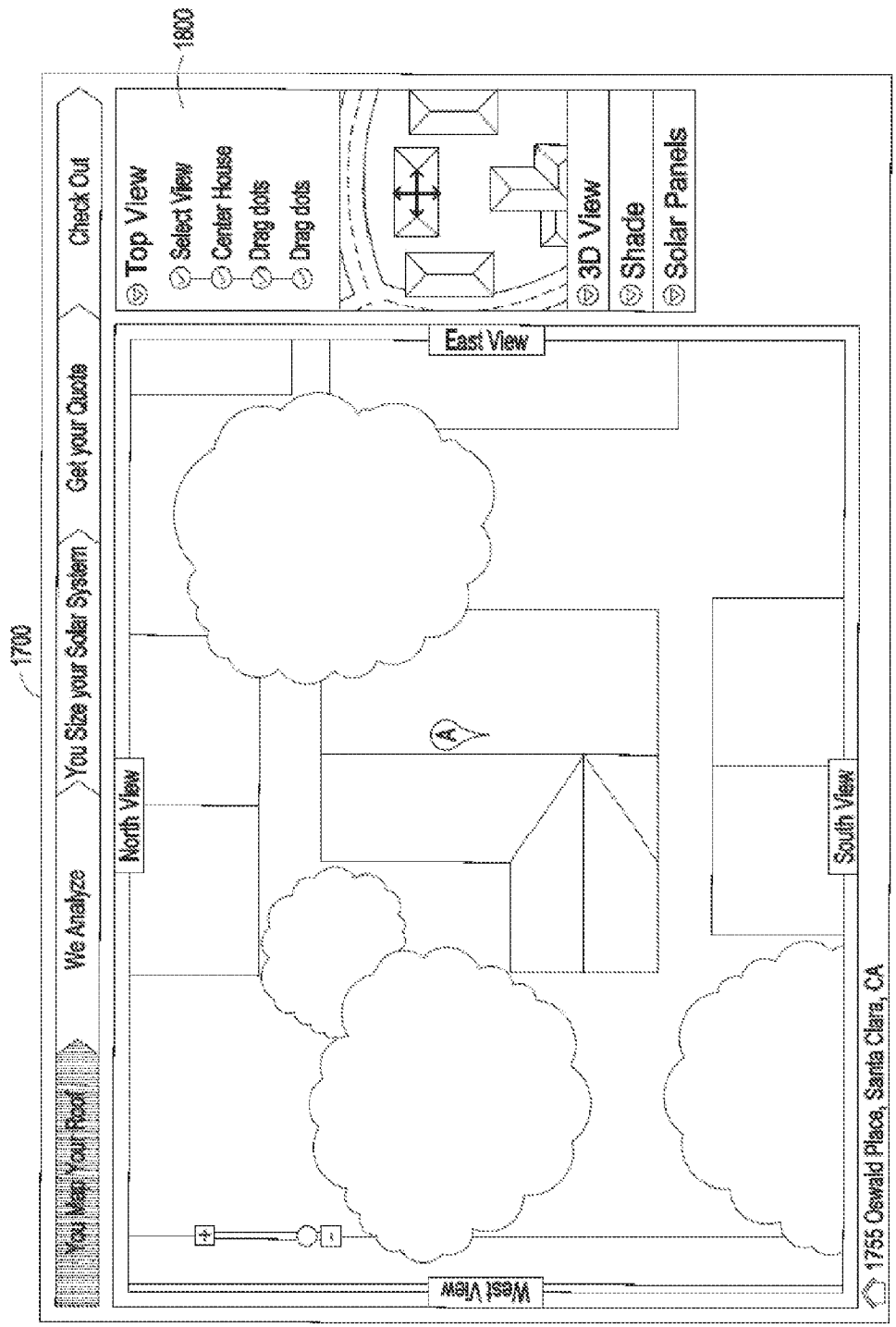
FIG. 18 is a screen capture illustrating the specialized user interface in accordance with another example embodiment.

FIG. 18 is a screen capture illustrating the specialized user interface 1700 in accordance with another example embodiment. Here, the user is viewing a top view, as indicated by area 1800.

Figure 19:
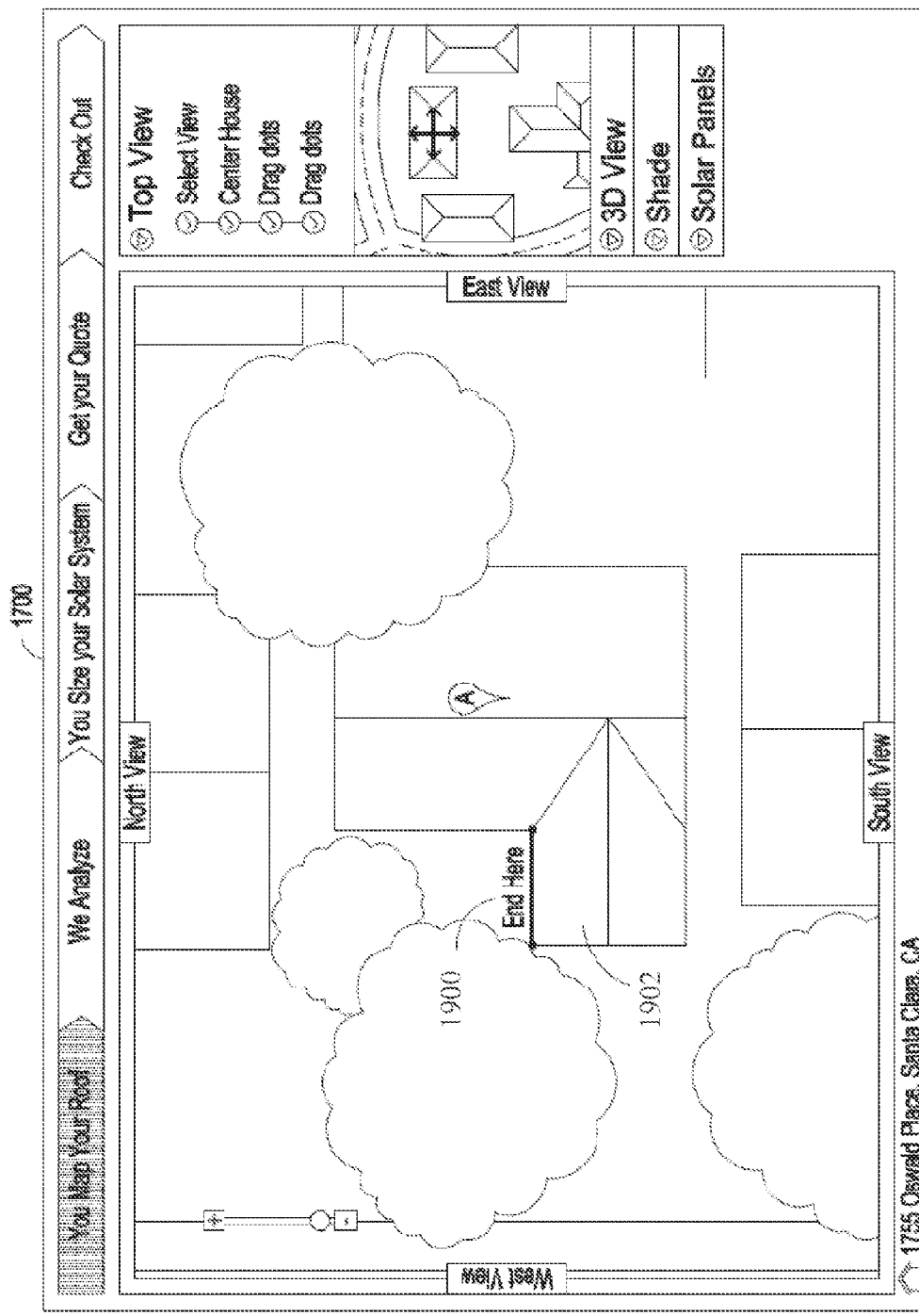
FIG. 19 is a screen capture illustrating the specialized user interface in accordance with another example embodiment.

FIG. 19 is a screen capture illustrating the specialized user interface 1700 in accordance with another example embodiment. Here, the user has drawn one line 1900 of a roof 1902. In some example embodiments, the specialized user interface 1700 may aid the user in drawing this line 1900 by, for example, snapping the line to a detected endpoint of the roof and/or snapping the line to the detected line of the roof, using image recognition techniques.

Figure 20:
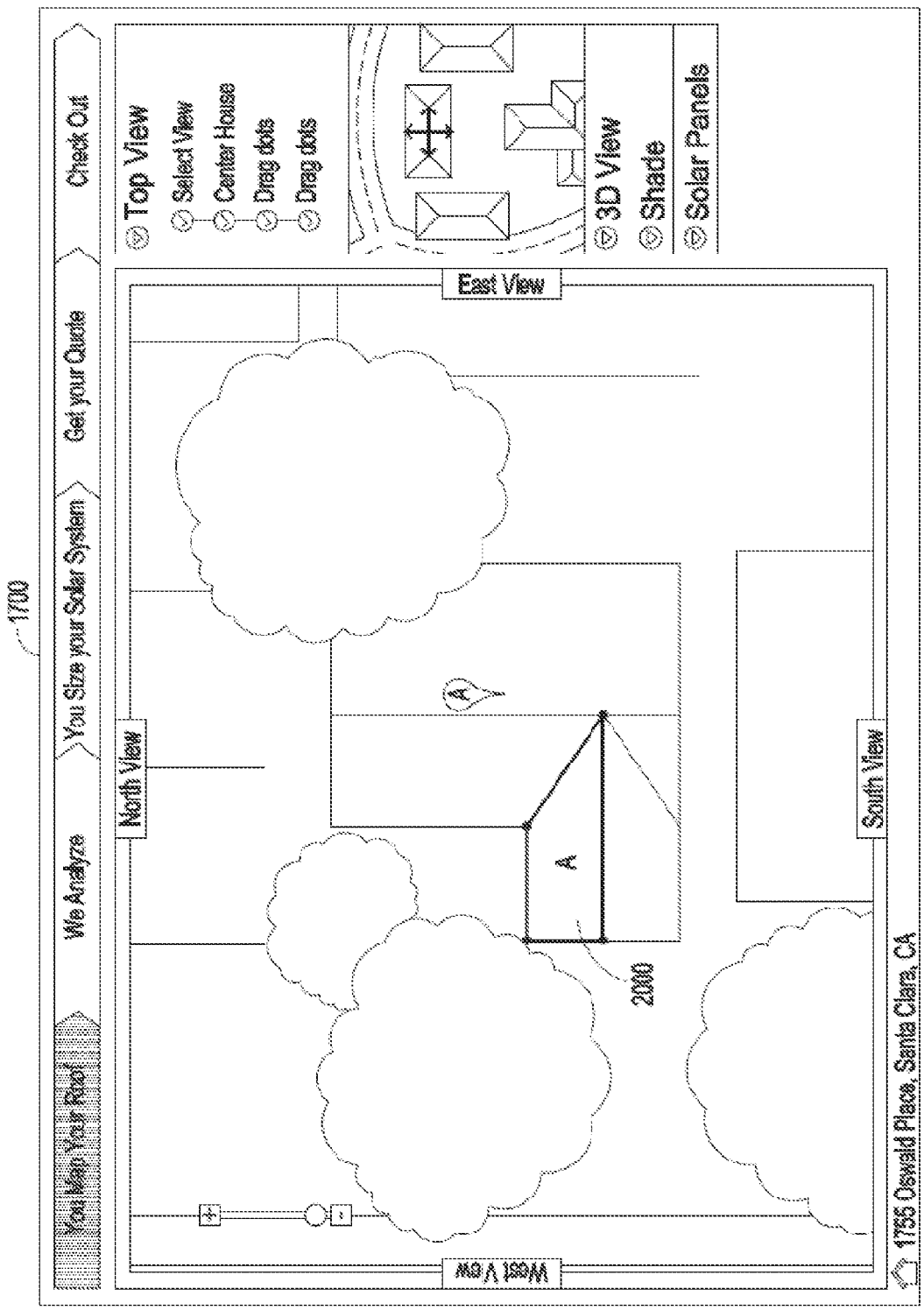
FIG. 20 is a screen capture illustrating the specialized user interface in accordance with another example embodiment.

FIG. 20 is a screen capture illustrating the specialized user interface 1700 in accordance with another example embodiment. Here, the user has completed outlining one roof segment 2000.

Figure 21:
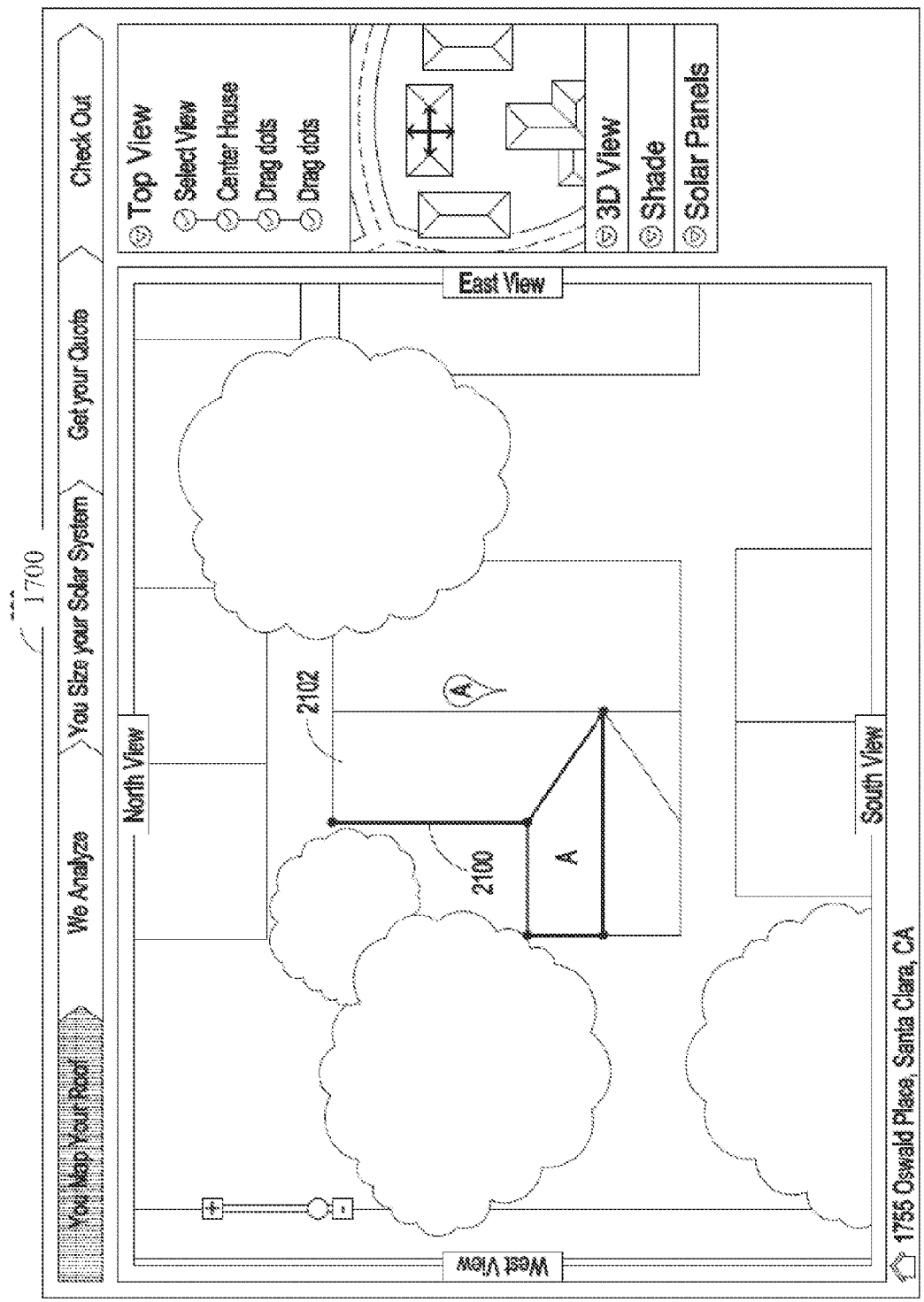
FIG. 21 is a screen capture illustrating the specialized user interface in accordance with another example embodiment.

FIG. 21 is a screen capture illustrating the specialized user interface 1700 in accordance with another example embodiment. Here, the user has drawn a line 2100 for a second roof segment 2102.

Figure 22:
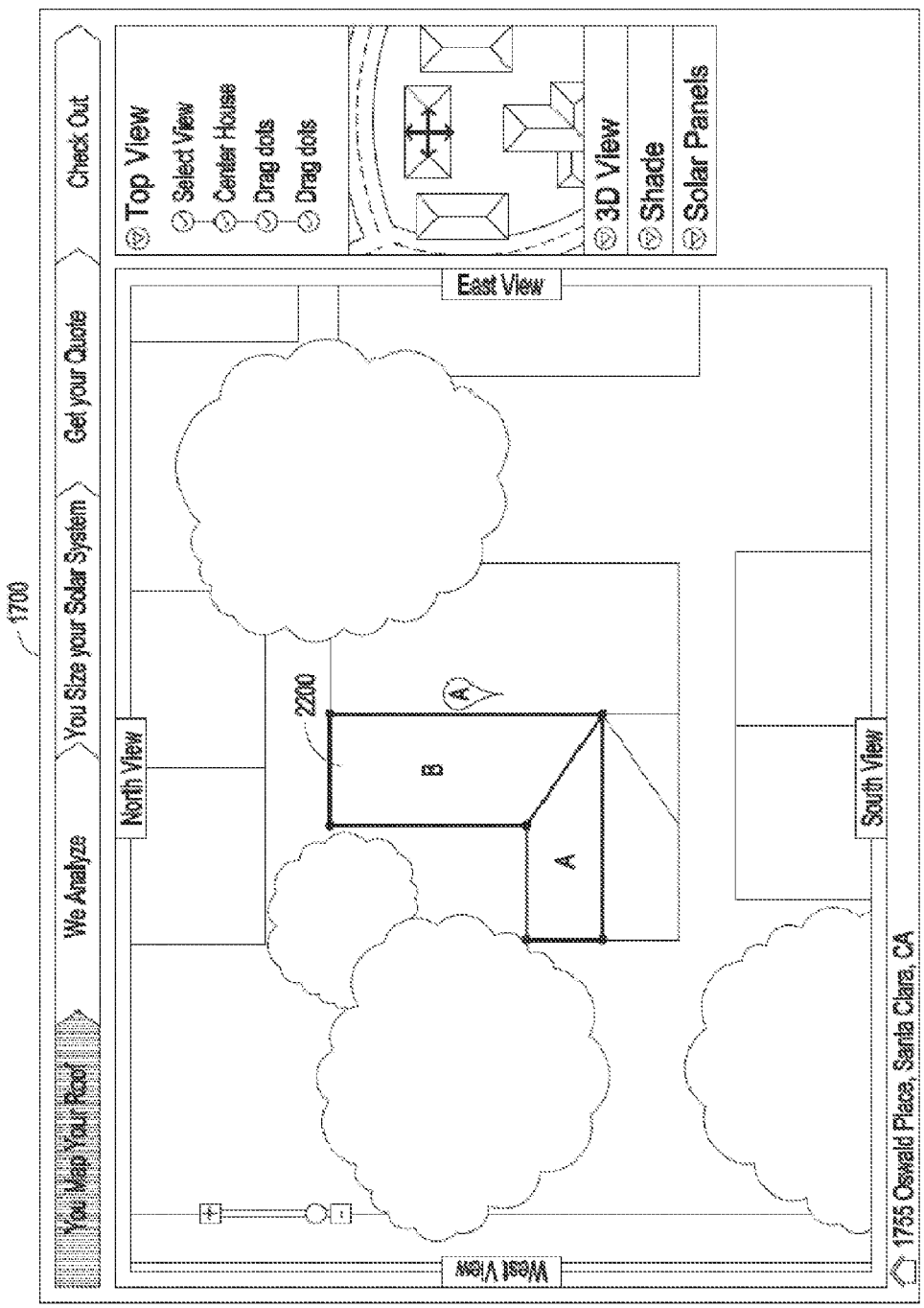
FIG. 22 is a screen capture illustrating the specialized user interface in accordance with another example embodiment.

FIG. 22 is a screen capture illustrating the specialized user interface 1700 in accordance with another example embodiment. Here, the user has completed outlining another roof segment 2200.

Figure 23:
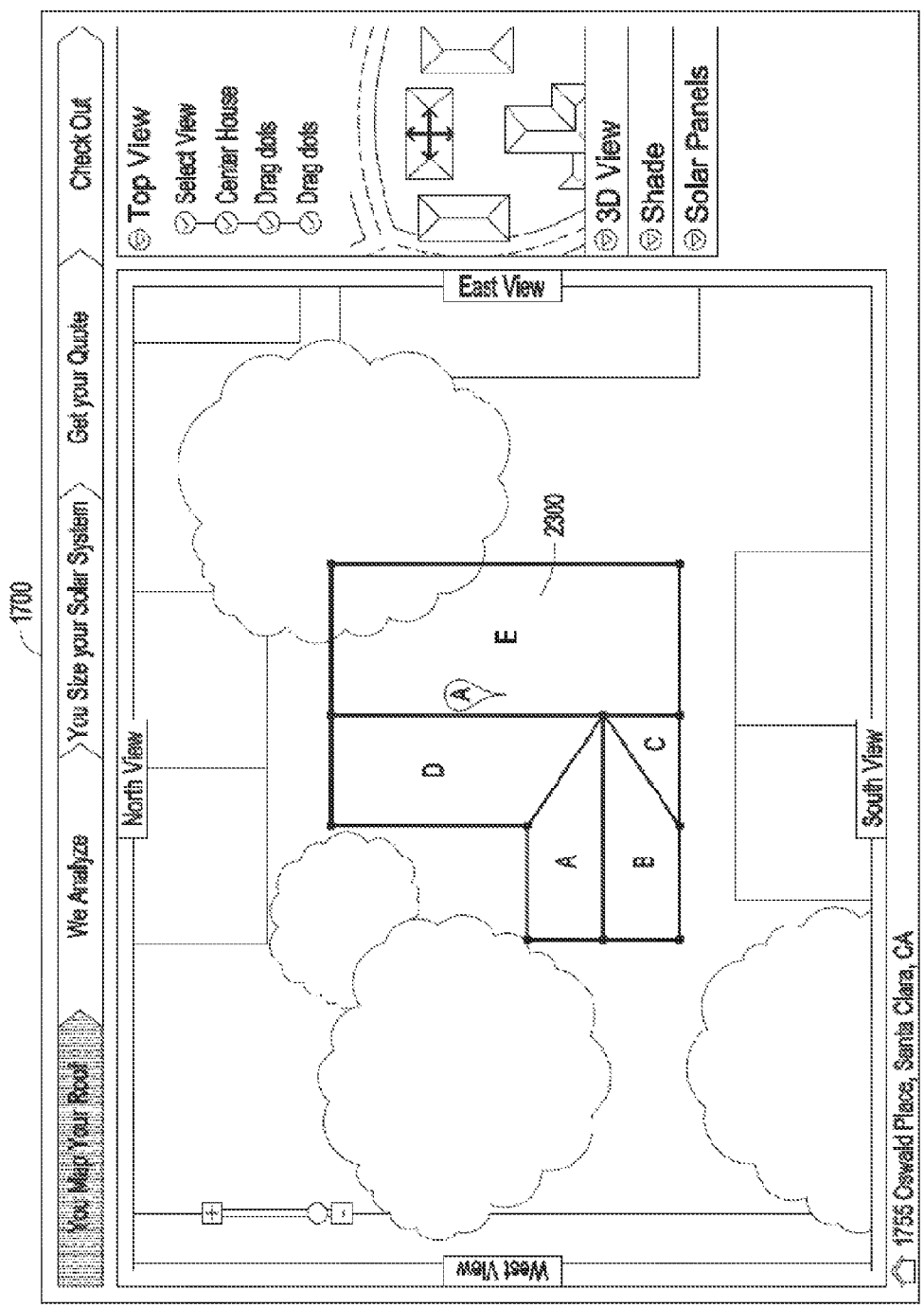
FIG. 23 is a screen capture illustrating the specialized user interface in accordance with another example embodiment.

FIG. 23 is a screen capture illustrating the specialized user interface 1700 in accordance with another example embodiment. Here, the user has completed outlining another roof segment 2300.

Figure 24:
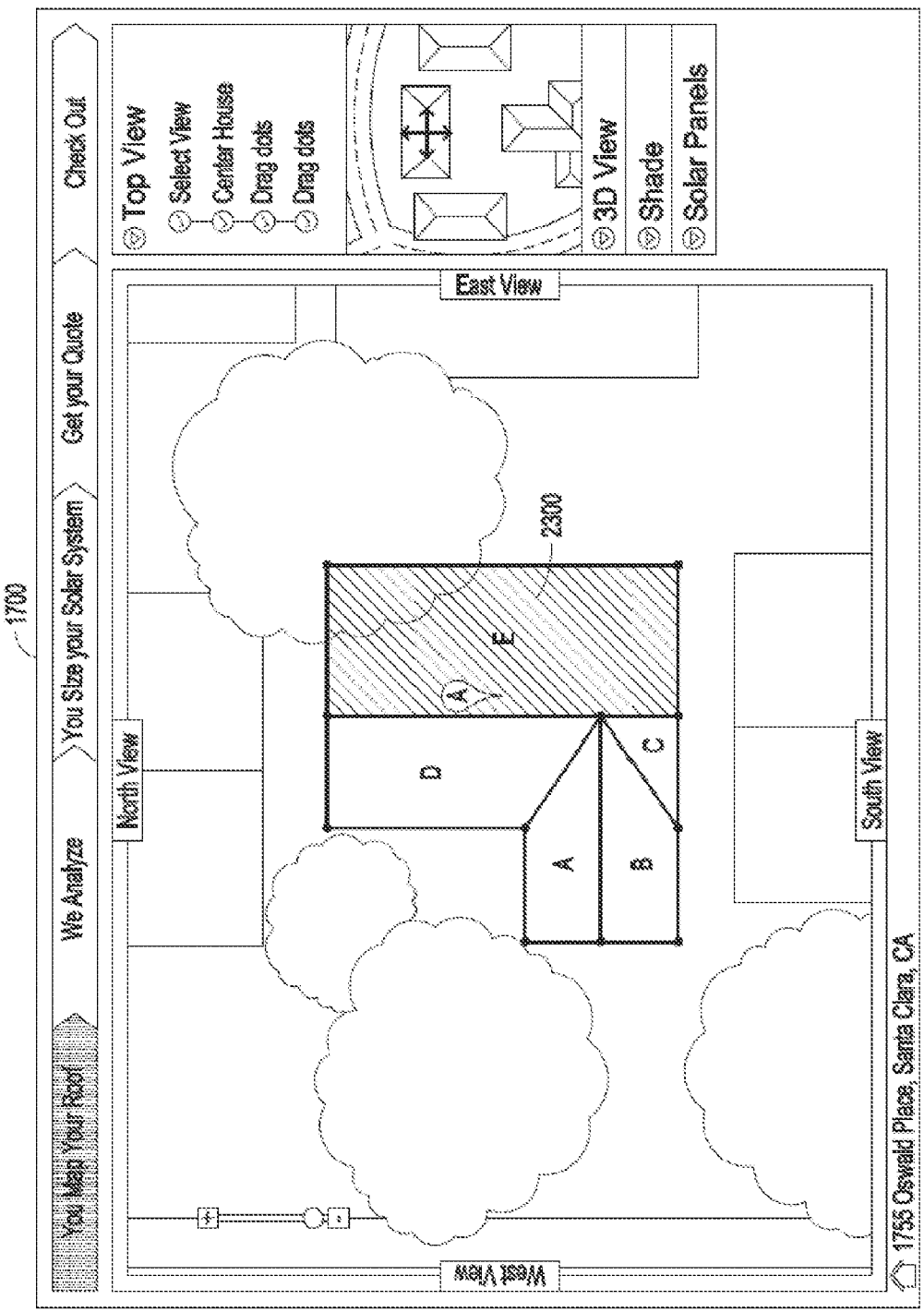
FIG. 24 is a screen capture illustrating the specialized user interface in accordance with another example embodiment.

FIG. 24 is a screen capture illustrating the specialized user interface 1700 in accordance with another example embodiment. Here, the user has selected roof segment 2300.

Figure 25:
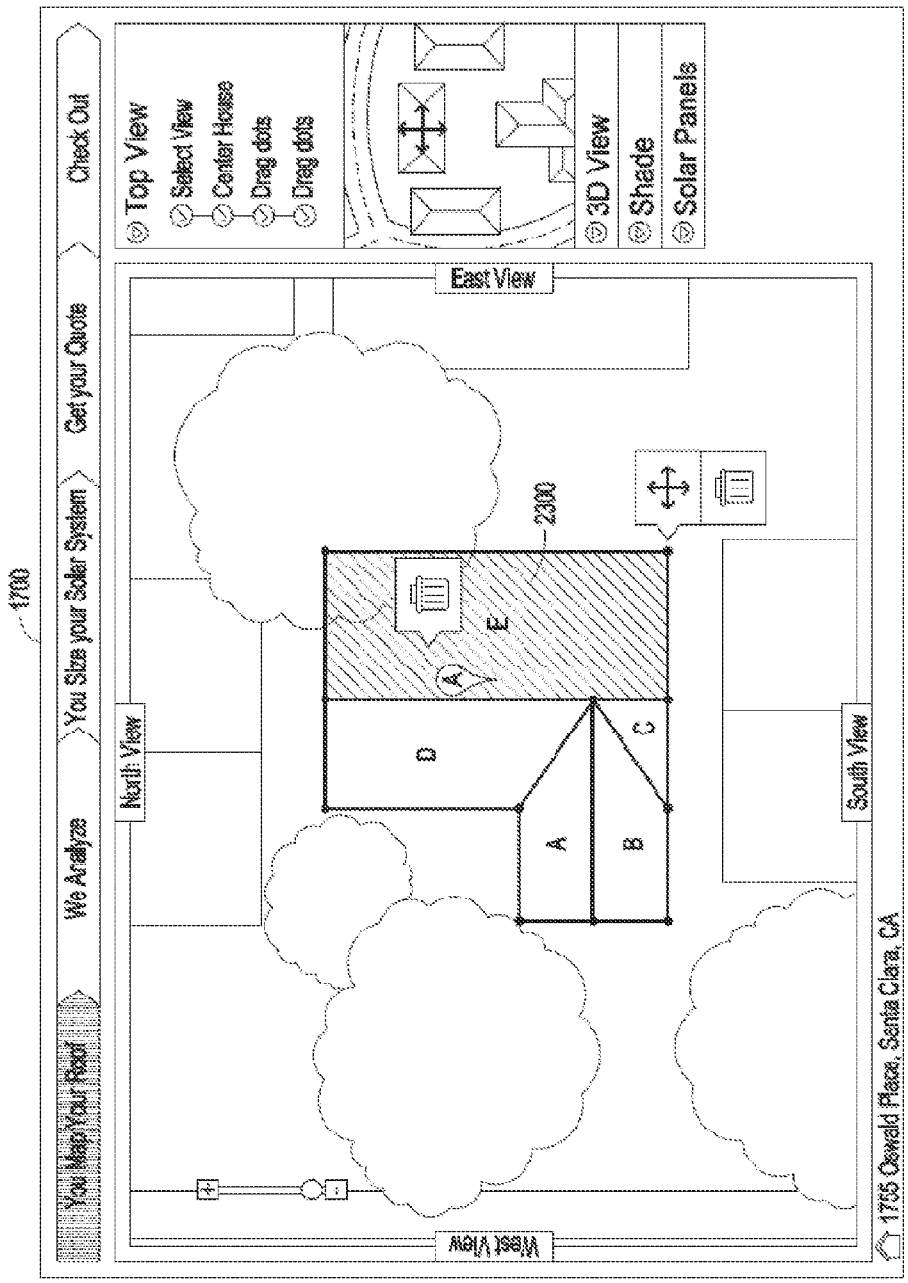
FIG. 25 is a screen capture illustrating the specialized user interface in accordance with another example embodiment.

FIG. 25 is a screen capture illustrating the specialized user interface 1700 in accordance with another example embodiment. Here, the user can perform various actions on the selected roof segment 2300, such as deleting or moving the selected roof segment 2300

Figure 26:
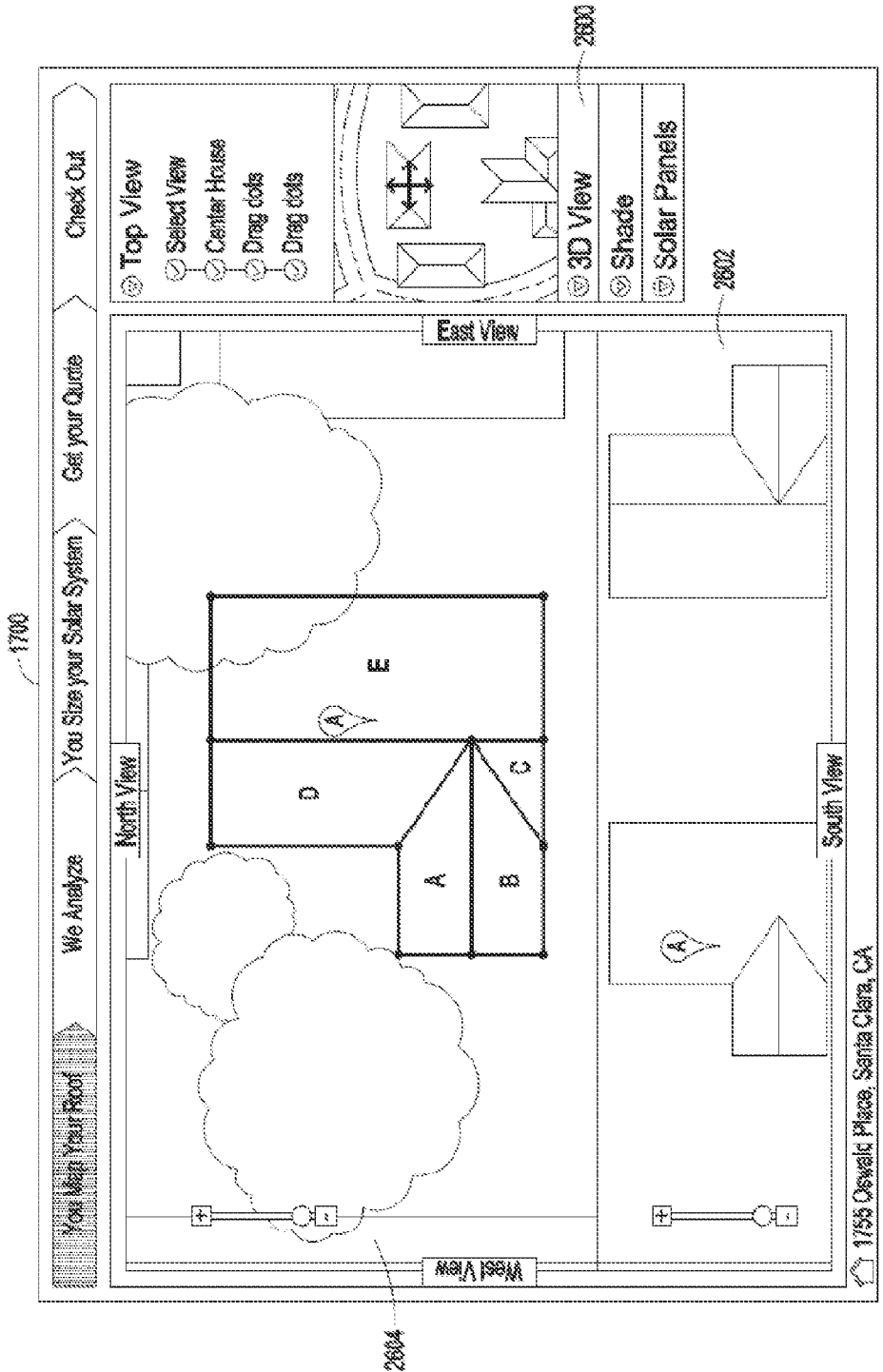
FIG. 26 is a screen capture illustrating the specialized user interface in accordance with another example embodiment.

FIG. 26 is a screen capture illustrating the specialized user interface 1700 in accordance with another example embodiment. Here, the user has selected to view a 3D view by selecting area 2600. This has brought up an additional window 2602 containing an angled three dimensional view of the house, here from a southern direction. The additional window 2602 is displayed beneath the original top view 2604 to indicate that the view is from a southern direction.

Figure 27:
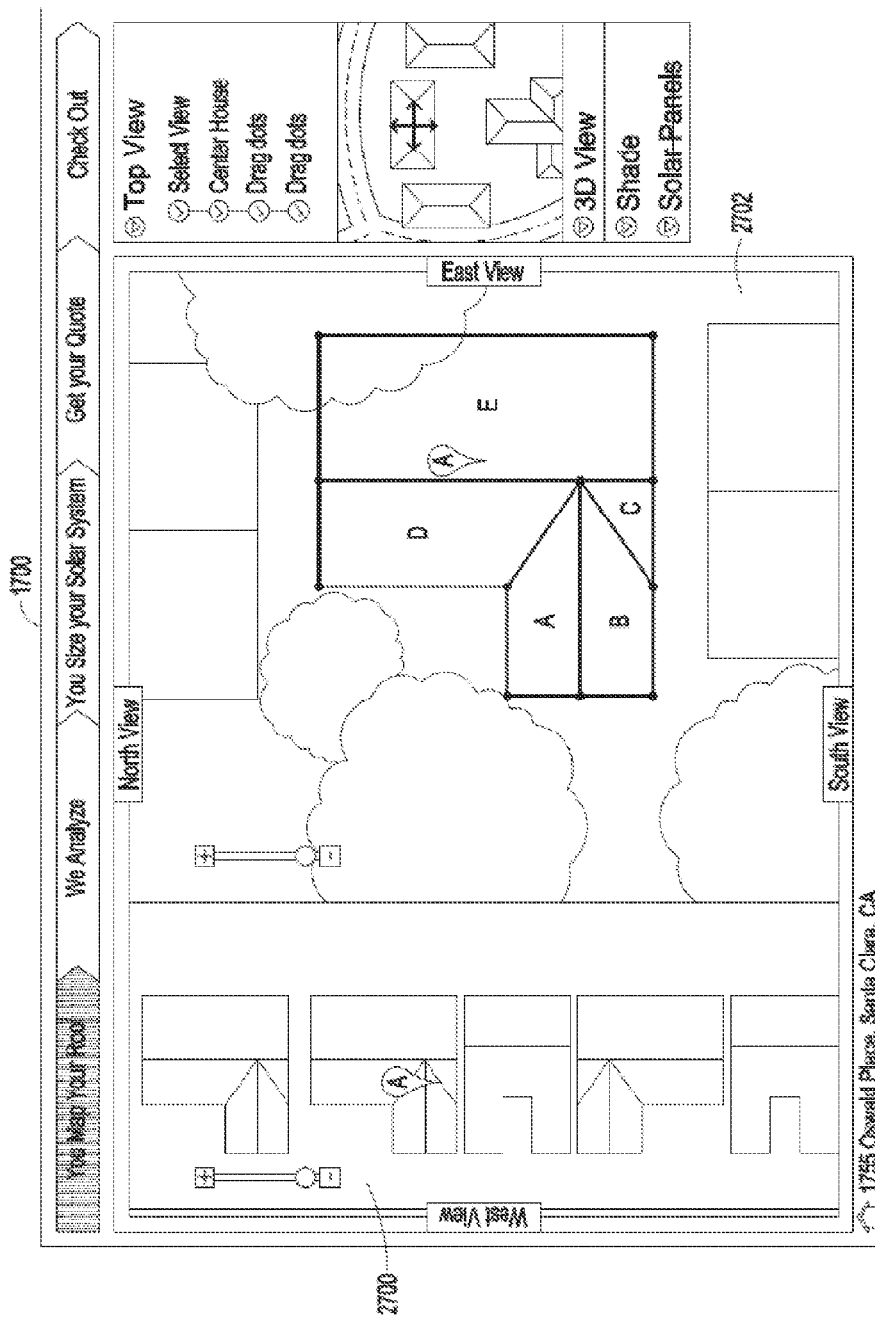
FIG. 27 is a screen capture illustrating the specialized user interface in accordance with another example embodiment.

FIG. 27 is a screen capture illustrating the specialized user interface 1700 in accordance with another example embodiment. Here, the user has altered the 3D view to a western view. The additional window 2700 is displayed to the left of the original top view 2702 to indicate that the view is from a westernly direction.

Figure 28:
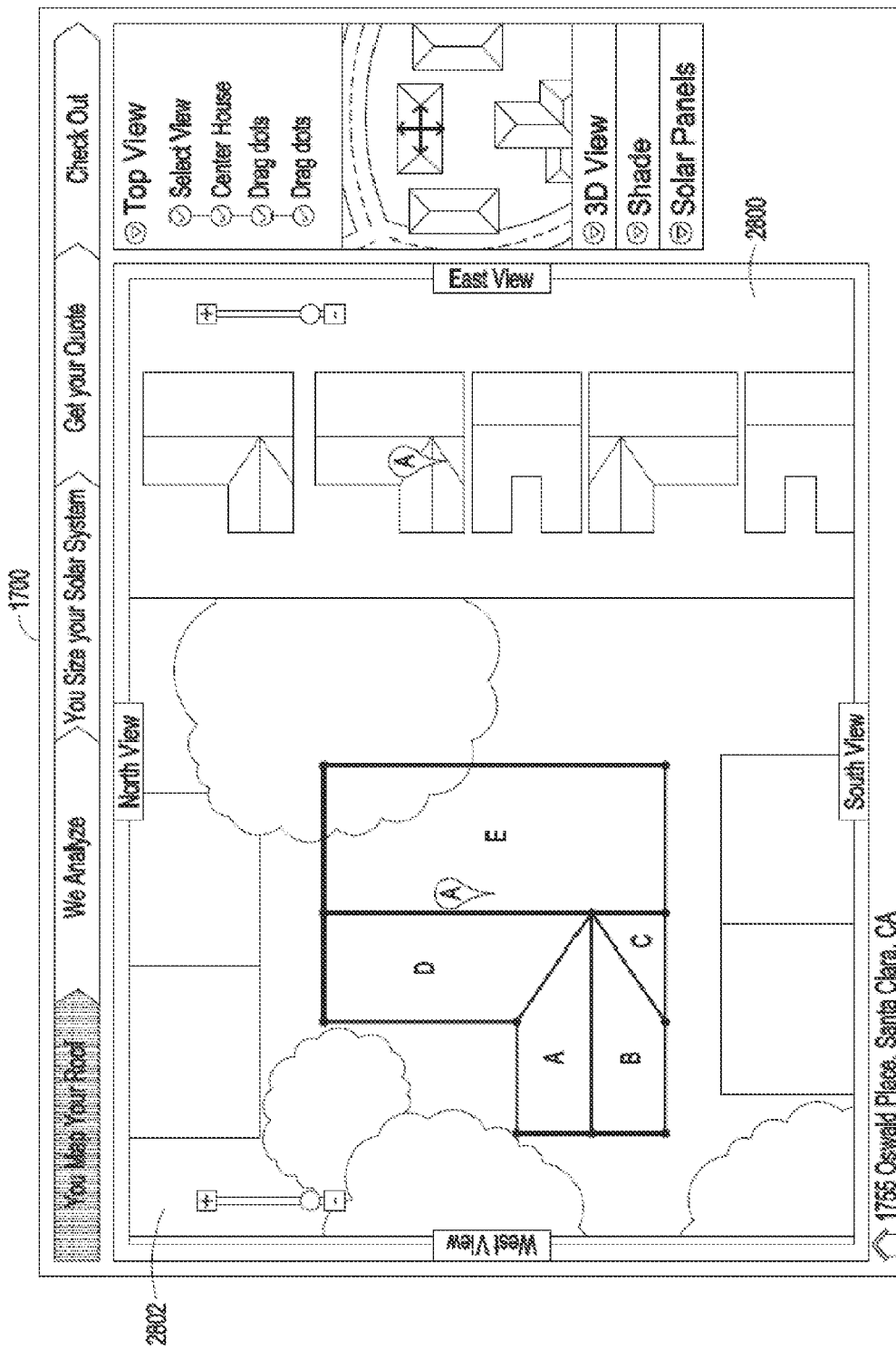
FIG. 28 is a screen capture illustrating the specialized user interface in accordance with another example embodiment.

FIG. 28 is a screen capture illustrating the specialized user interface 1700 in accordance with another example embodiment. Here, the user has altered the 3D view to an eastern view. The additional window 2800 is displayed to the right of the original top view 2802 to indicate that the view is from a westernly direction.

Figure 29:
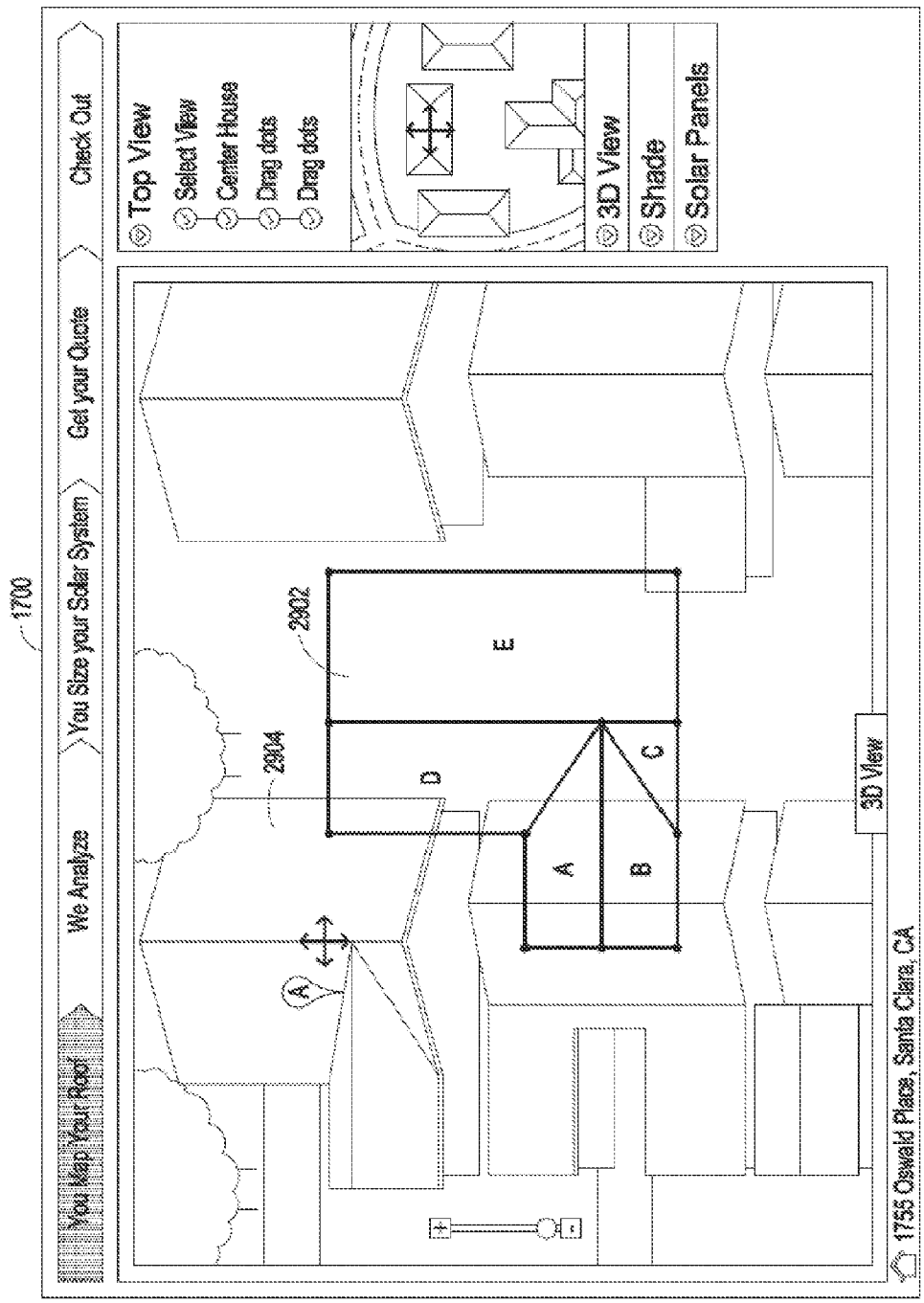
FIG. 29 is a screen capture illustrating the specialized user interface in accordance with another example embodiment.

FIG. 29 is a screen capture illustrating the specialized user interface 1700 in accordance with another example embodiment. Here, the user has selected the 3D view to be presented alone. As can be seen, the mapping 2902 the user had provided in the top view has been carried over to the 3D view. As also can be seen in this figure, the user's house 2904 is offcenter from the mapping 2902. The tool may allow the user to drag the satellite photo to align the house 2904 with the mapping 2902.

Figure 30:
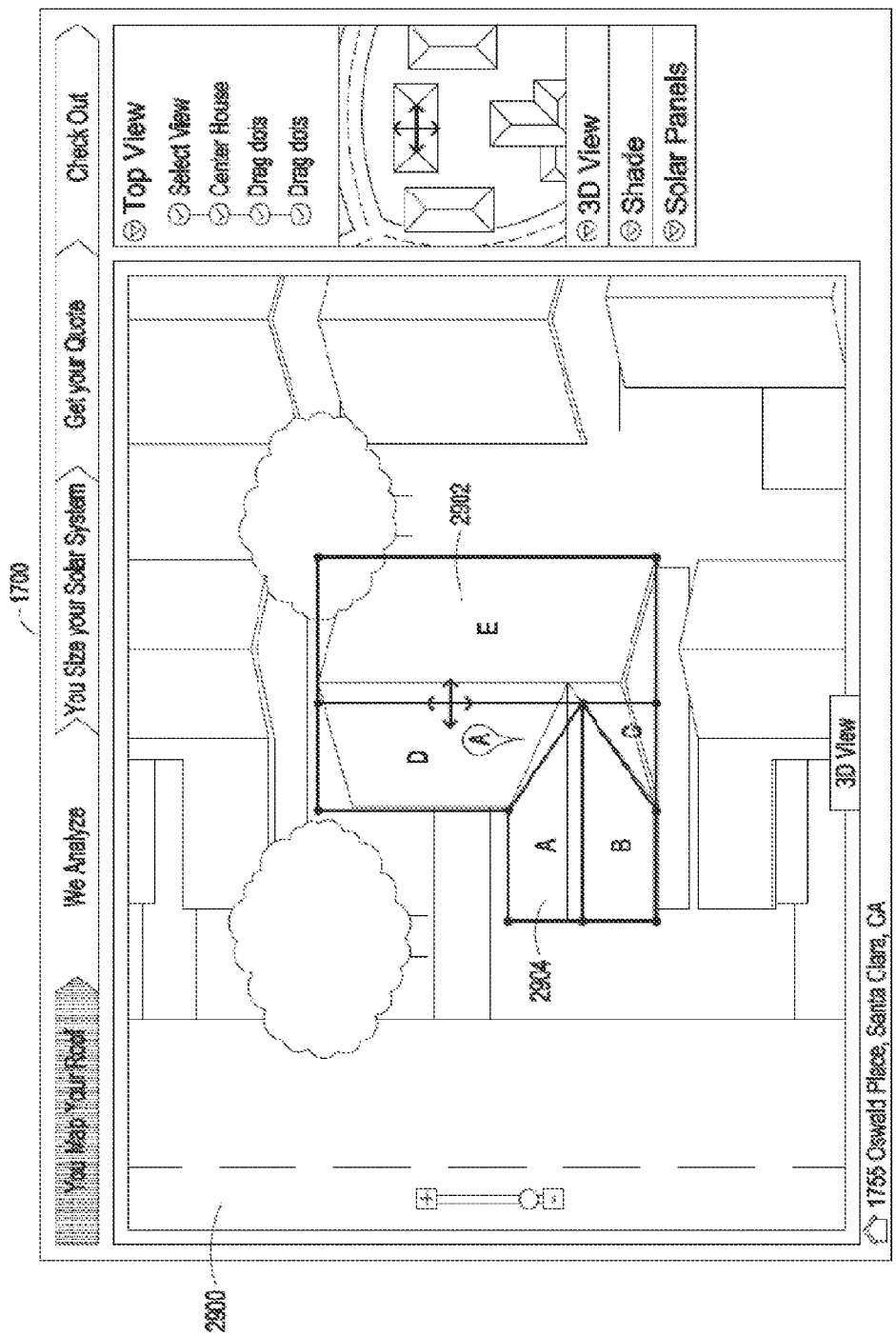
FIG. 30 is a screen capture illustrating the specialized user interface in accordance with another example embodiment.

FIG. 30 is a screen capture illustrating the specialized user interface 1700 in accordance with another example embodiment. Here, the user has aligned the house 2904 with the mapping 2902. Notably, while the house 2904 is now depicted as directly underneath the mapping 2902, the mapping 2902 does not line up perfectly with the rooflines in this satellite photo. As such, the user will need to adjust one or more calibration points to align the rooflines exactly with the mapping.

Figure 31:
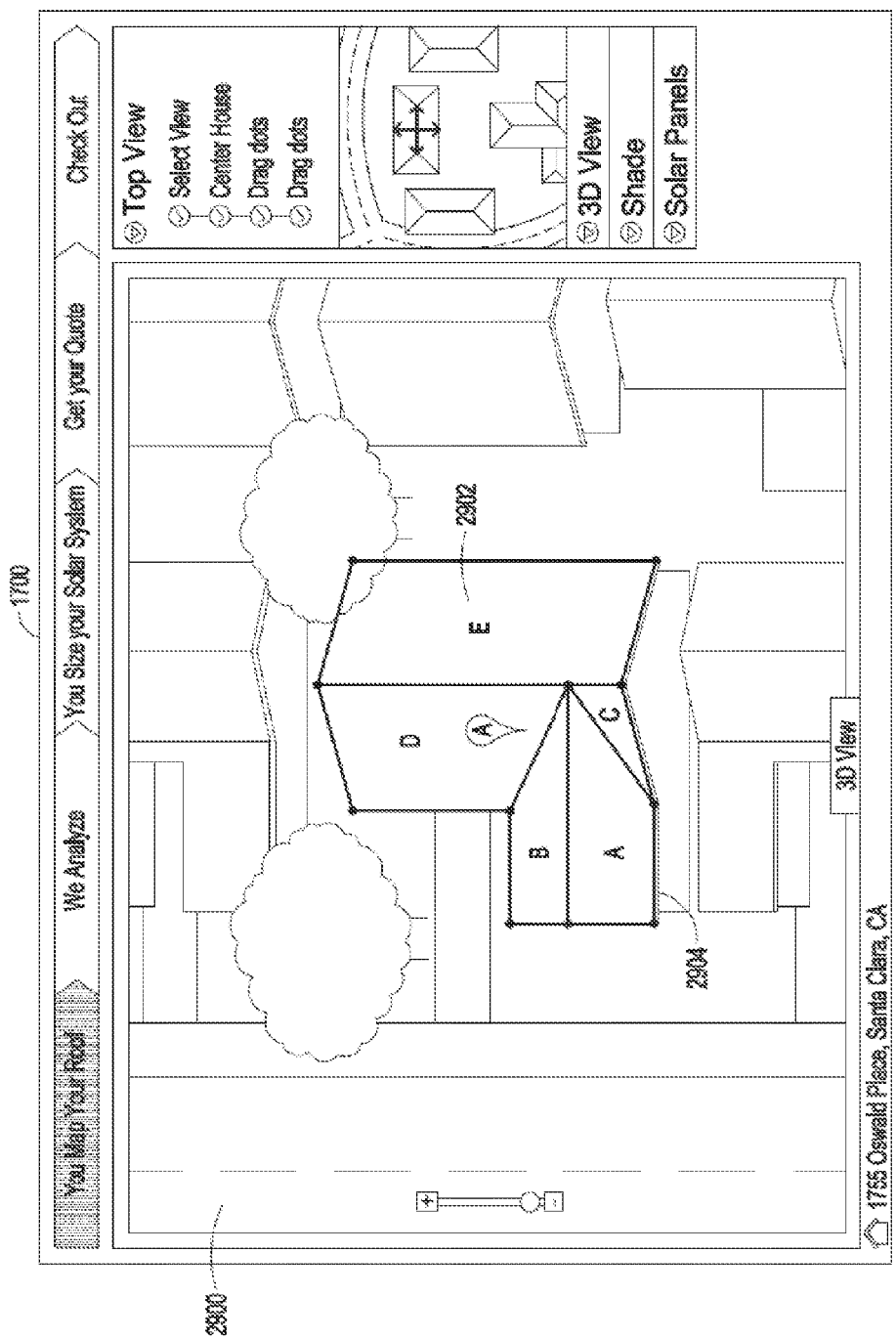
FIG. 31 is a screen capture illustrating the specialized user interface in accordance with another example embodiment.

FIG. 31 is a screen capture illustrating the specialized user interface 1700 in accordance with another example embodiment. Here the user has adjusted all of the rooflines so that the mapping 2902 covers the roof of the house 2904 exactly, in accordance with an example embodiment.

Figure 32:
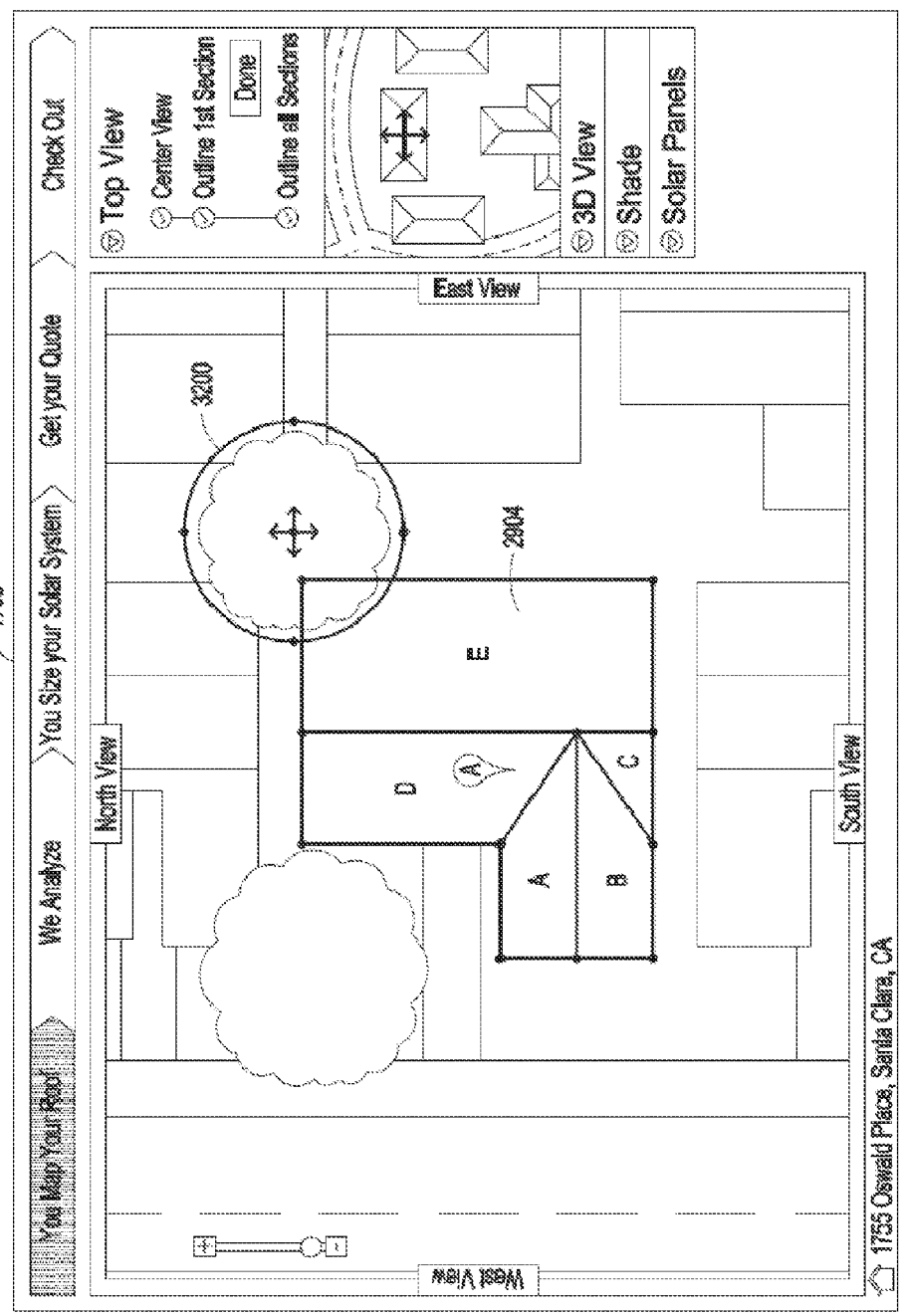
FIG. 32 is a screen capture illustrating the specialized user interface in accordance with another example embodiment.

FIG. 32 is a screen capture illustrating the specialized user interface 1700 in accordance with another example embodiment. Here the user has identified a keep-out area 3200 in a top view of the house 2904. This keep-out area 3200 corresponds to a tree adjacent to the house 2904.

Figure 33:
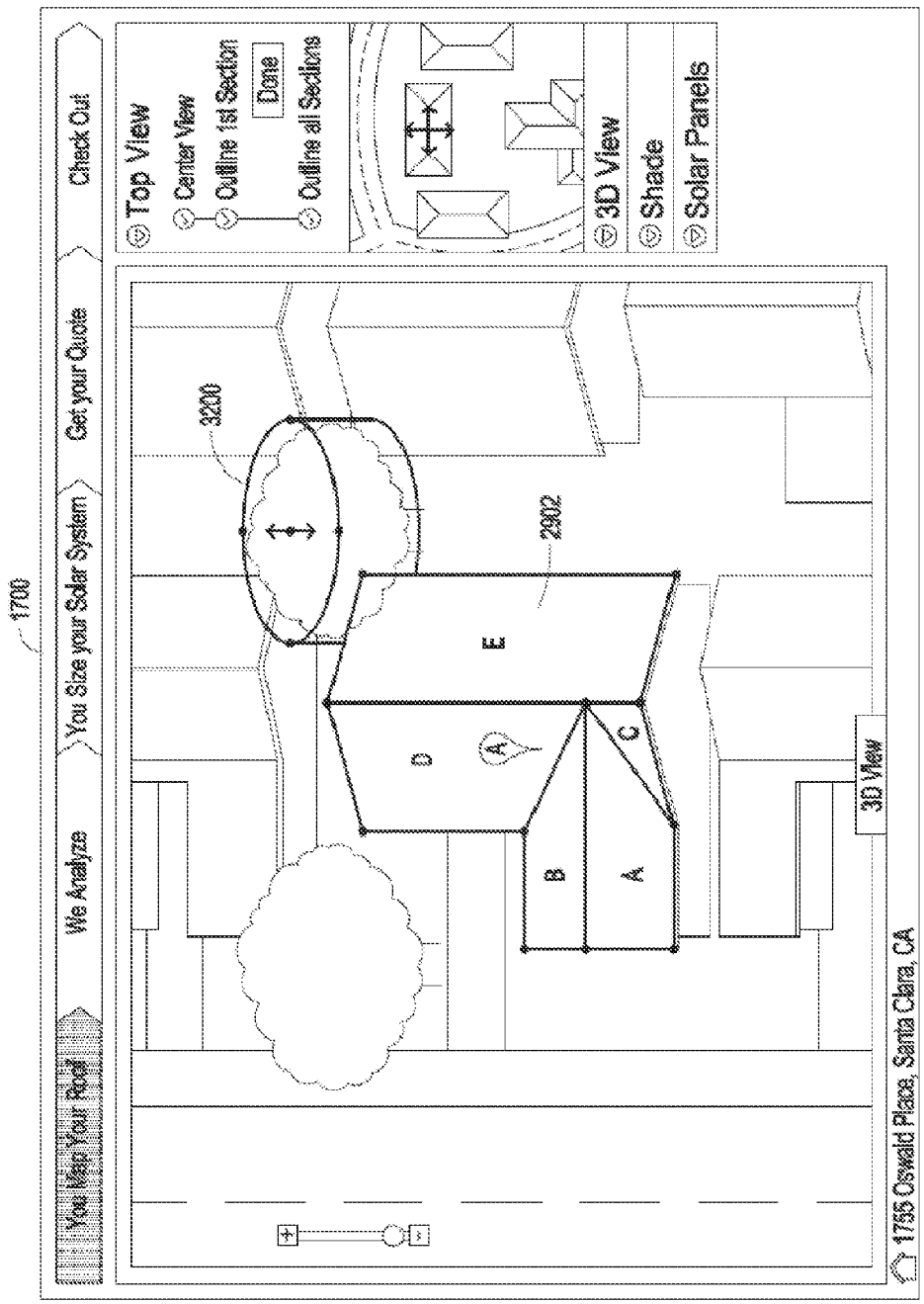
FIG. 33 is a screen capture illustrating the specialized user interface in accordance with another example embodiment.

FIG. 33 is a screen capture illustrating the specialized user interface 1700 in accordance with another example embodiment. Here, the keep-out area 3200 identified by the user is depicted in a 3D view. Much like with the roof mapping 2902, the user is able to adjust the calibration points of the keep-out area 3200 in multiple angled views, allowing the system to precisely derive the dimensions of the keep-out area 3200.

Figure 34:
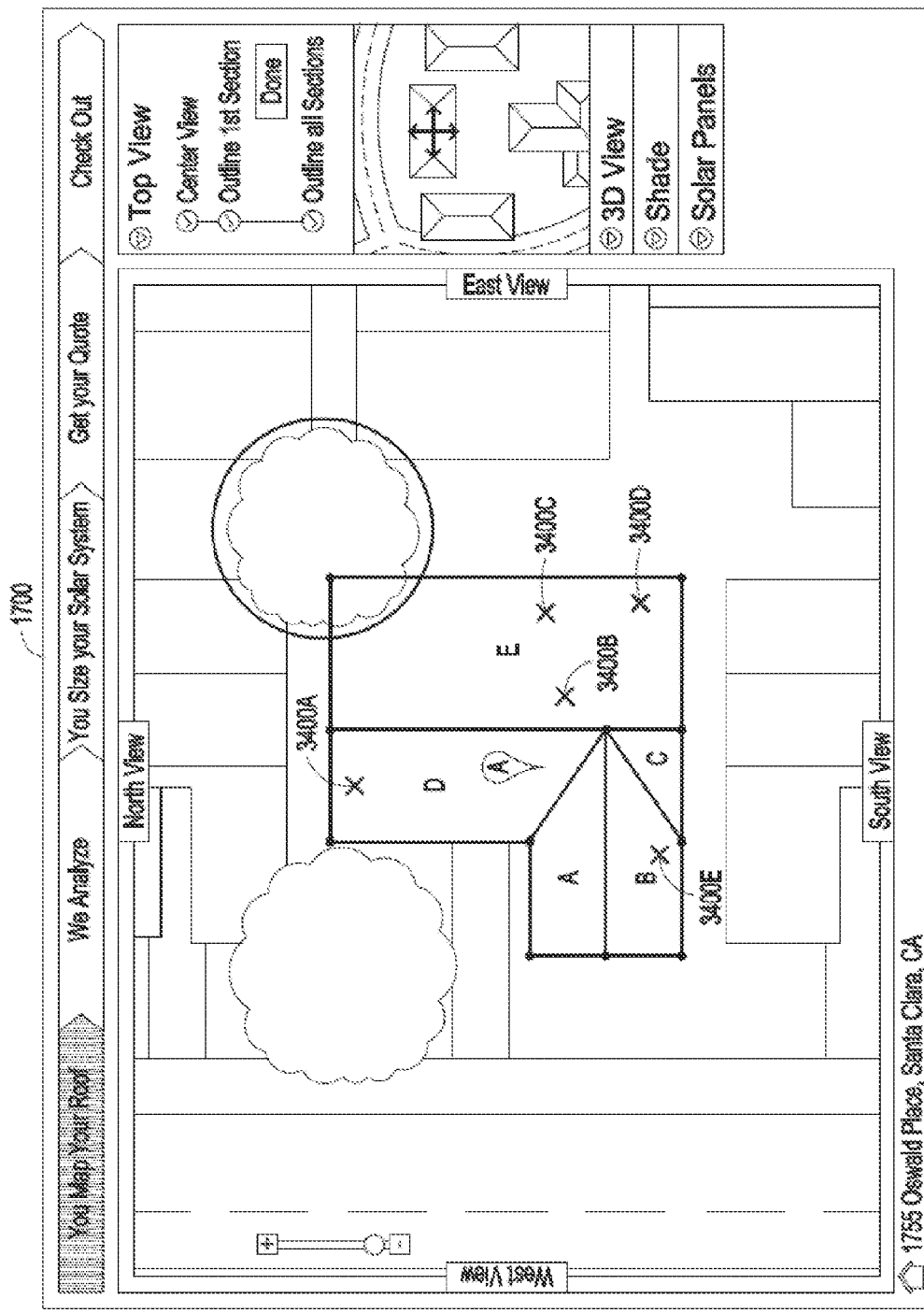
FIG. 34 is a screen capture illustrating the specialized user interface in accordance with another example embodiment.

FIG. 34 is a screen capture illustrating the specialized user interface 1700 in accordance with another example embodiment. Here, additional keep-out areas 3300A, 3300B, 3300C, 3300D, 3300E may be marked.

Figure 35:
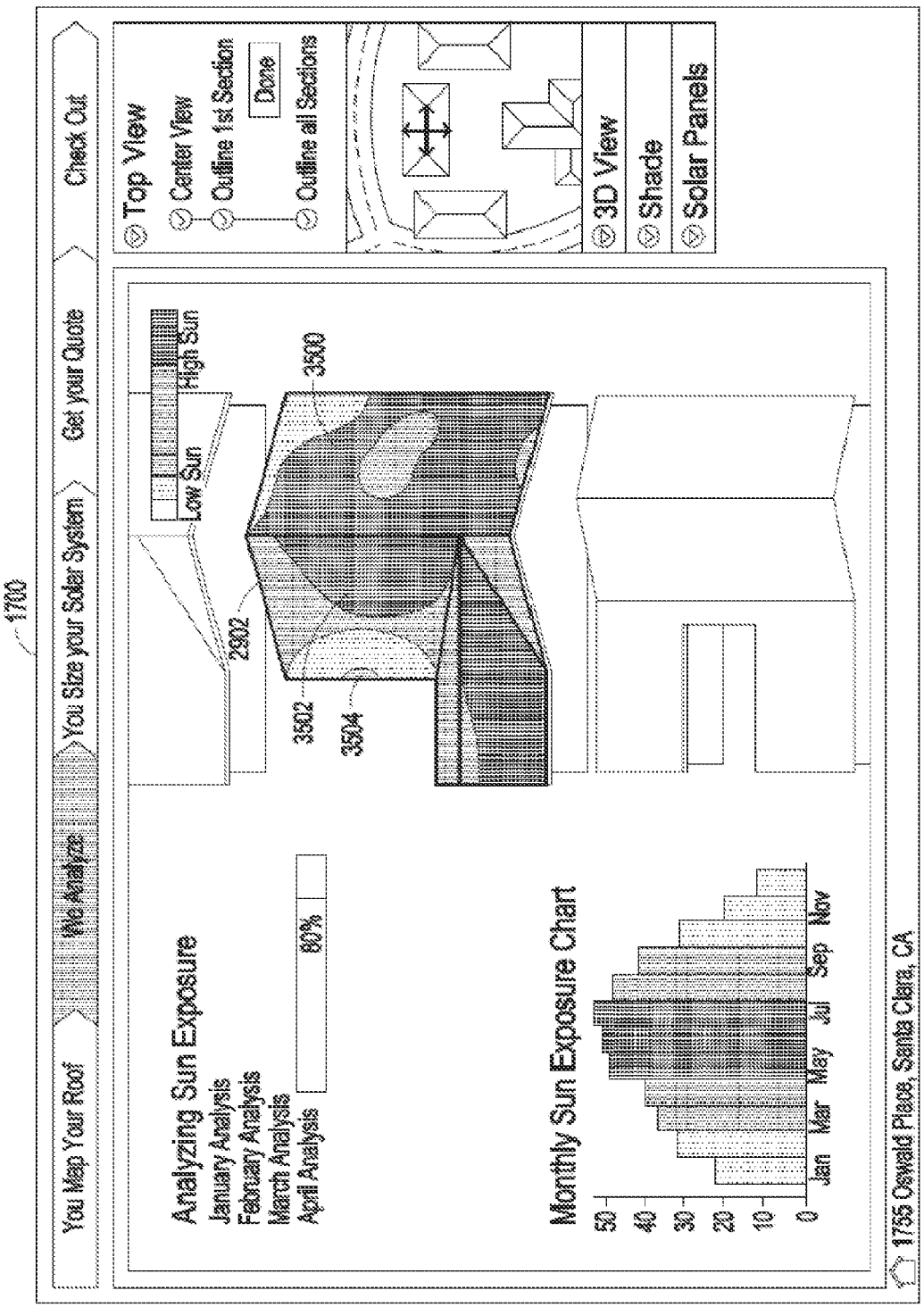
FIG. 35 is a screen capture illustrating a heat map on mapping in accordance with an example embodiment.

In an example embodiment, the layouts of the solar panels may be based at least in part on one or more heat maps overlaid on a completed mapping, such as the completed mapping 2902. FIG. 35 is a screen capture illustrating a heat map 3500 on mapping 2902 in accordance with an example embodiment. The heat map 3500 reflects a prediction of sun activity over the course of a year. Specifically, the heat map 3500 may reflect the relative number of hours each portion of the roof may receive sun, with the lighter areas such as area 3502 indicating more hours of sun and the darker areas, such as area 3504 indicating fewer hours of sun. In some example embodiments, the heat map 3500 may also be a measure of how direct the sunlight is as opposed to just based on hours. In a sense, the heat map 3500 will reflect the total energy imparted by the sun over the year over the various areas of the roof. As such it may take into account not just aggregate hours of sunlight for each portion but the angle of the sun during those hours. This may be estimated by utilizing astronomical information indicating sun position information over the year for the precise location where the house is found. It may also take into account any obstructions that may be evident from the satellite images. In such a case, it may be helpful for the user to provide mappings of not just the roof of the house, but also mappings of any surrounding potential obstructions, such as trees, telephone poles, walls, neighbor buildings, etc., all of which may impact the energy imparted by the sun at the various areas of the roof. The user could, for example, utilize a tool similar to that as described above to map not just the dimensions of the roof but of any surrounding obstructions, again by using two more satellite images.

In an example embodiment, historical weather information could also be utilized to help in this estimate. For example, while astronomical information may indicate that a particular area of the roof may get a certain number of hours of direct sun per year, that particular area of the roof may only get that sun (according to the astronomical information) during the winter months, and if historical weather patterns indicate that most winter days are cloudy in the region, then the actual sun received by that area of the roof may be much less than the astronomical information implied. Using the historical weather patterns allows the system to correct for such issues.

FIG. 36 is a screen capture illustrating the specialized user interface 1700 in accordance with another example embodiment. Here, the user has progressed to sizing their solar system. A number of package options 3600 may be displayed. Here, the user is presented with an idea of their current electrical bill in column 3602, and then presented with a pay as you go option 3604 and a purchase option 3606, as well as the breakdown of costs and savings from each. These costs and savings may be estimated based on predicted bids, as in some example embodiments no bids would have been actually received at this point yet.

Figure 37:
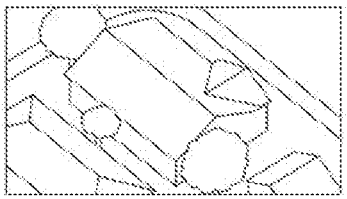
FIG. 37 is a screen capture illustrating the specialized user interface in accordance with another example embodiment.

FIG. 37 is a screen capture illustrating the specialized user interface 1700 in accordance with another example embodiment. Here, the user has progressed to obtaining a quote. AS can be seen, a quote 3700 is displayed, including a breakdown of costs and savings.

In another example embodiment, the above-described tool may be extended to images taken from something other than overhead (e.g., satellite) imagery. For example, the front of a user's home could be similarly mapped to aid in bidding for painting or other remodeling projects. This could be performed by, for example, using two different angles of the user's home taken from street view and applying similar techniques as described above. In such instances, however, it may be necessary to have information about the distance between the camera used for the street view and the house in order to complete the dimension calculations.

In another example embodiment, the above-described tool may be used to derive dimensions of objects other than homes. Even more generally, the input images could be any photographs or similar mappings, such as photographs taken from a user's smartphone, digital camera, or other mobile device. For example, the user may take multiple pictures of a piece of furniture they are thinking about purchasing and use the tool to derive dimension information for the furniture. In such instances the user may be prompted to, for example, provide information about how far away they are standing from the object when the pictures are taken.

Figure 38:
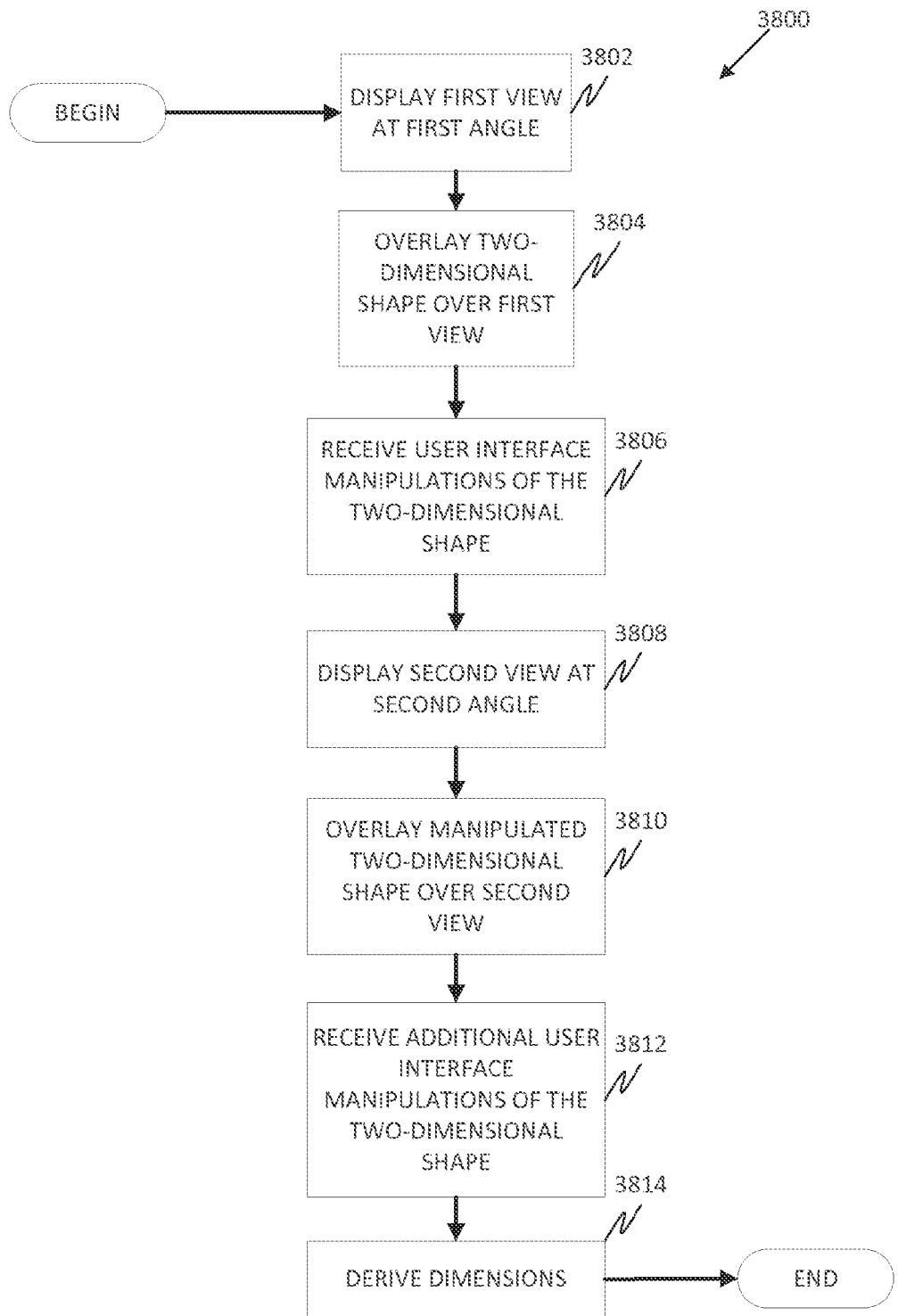
FIG. 38 is a flow diagram illustrating a method in accordance with an example embodiment.

FIG. 38 is a flow diagram illustrating a method 3800 in accordance with an example embodiment. At operation 3802, a first view of a real-world object is displayed from a first angle. At operation 3804, a two dimensional shape is overlaid over the first view. At operation 3806, user interface manipulations of the two dimensional shape are received from the user, defining the boundaries of a first side of the real-world object in the first view. At operation 3808, second view of the real-world object is displayed from a second angle. At operation 3810, the manipulated two dimensional shape is overlaid over the second view. At operation 3812, additional user interface manipulations of the two dimensional are received from the user, defining the boundaries of the first side of the real-world object in the second view. At operation 3814, dimensions of the first side of the real-world object are derived from the manipulated two-dimensional object from the second view.

Figure 39:
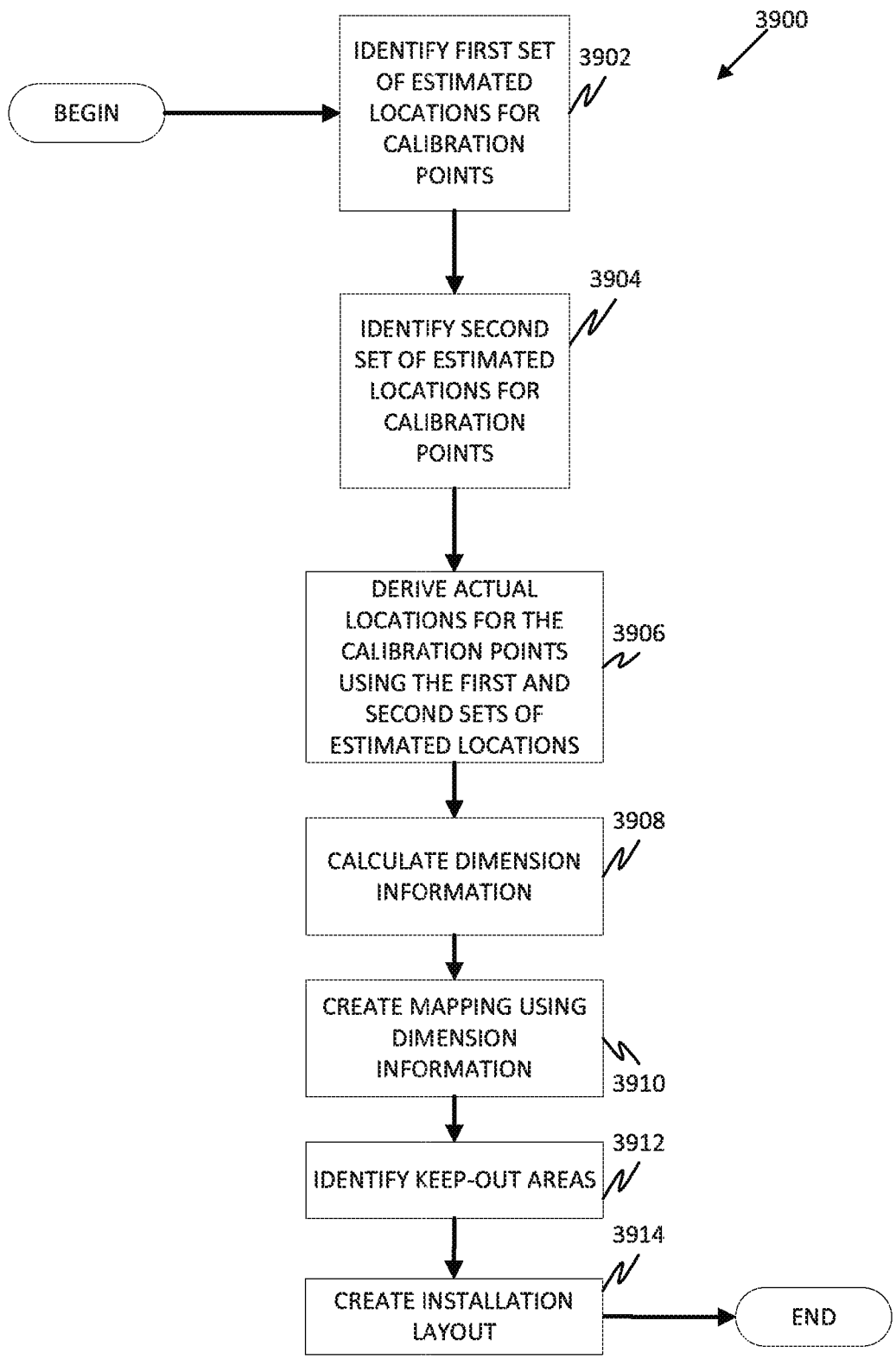
FIG. 39 is a flow diagram illustrating a method in accordance with another example embodiment.

FIG. 39 is a flow diagram illustrating a method 3900 in accordance with another example embodiment. At operation 3902, a first set of estimated locations for calibration points in a roof in a first satellite image is identified, the first satellite image having a first zoom level and a first angle relative to ground. At operation 3904, a second set of estimate locations for the calibration points in the roof in a second satellite image is identified, the second satellite image having a second zoom level and a second angle relative to ground. At operation 3906, actual locations for the calibration points are derived using the first and second sets of estimated locations, the first and second zoom levels, and the first and second angles. At operation 3908, dimension information for the roof is calculated based on the derived actual locations for the calibration points. At operation 3910, a roof mapping is created using the dimension information. At operation 3912, one or more keep out areas are identified on the roof mapping, the keep out areas identifying areas where a solar panel should not be installed. At operation 3914, a layout of a solar panel installation is created using the roof mapping and the keep out areas.

In another example embodiment, an online marketplace or e-commerce site can be utilized to link potential buyers of solar panels or other systems can be designed using the above described tools with potential providers of such solar panels or systems. An iterative process may be used whereby a potential buyer, who may be unsophisticated, may utilize the above tools to provide information to the potential providers that can be used to make appropriate bids. In the example of a solar panel project, roof dimensions and angles, as well as keep out areas or other obstructions can be provided to a plurality of potential providers of solar panels. These providers may then utilize this information in preparing bids that the potential buyer can review. Multiple rounds of bidding may be utilized so that the potential buyer receives the best possible price for the project.

In an example embodiment, the potential providers for the project may edit one or more parameters of the project prior to providing a bid for the project. For example, a consumer may have provided a rough solar panel layout in accordance with instructions provided by the tools. A solar panel provider, however, may determine that the user's configuration is not optimal, and may correct the configuration prior to providing a bid. Additionally, these corrected parameters could then be accepted by the user and transmitted to other potential providers as well, so that the every potential provider is bidding on the same project with the same exact parameters.

This iterative-style bidding process may be extended outside of the realm of solar panels to other ecommerce transactions. It represents a vastly different information flow than traditional ecommerce transactions, which currently only involve information flowing from a single party to another single party. While multibidder transactions involve a single party communicating with many parties, the information that is transmitted is only ever transmitted from one party to another party.

Figure 40:
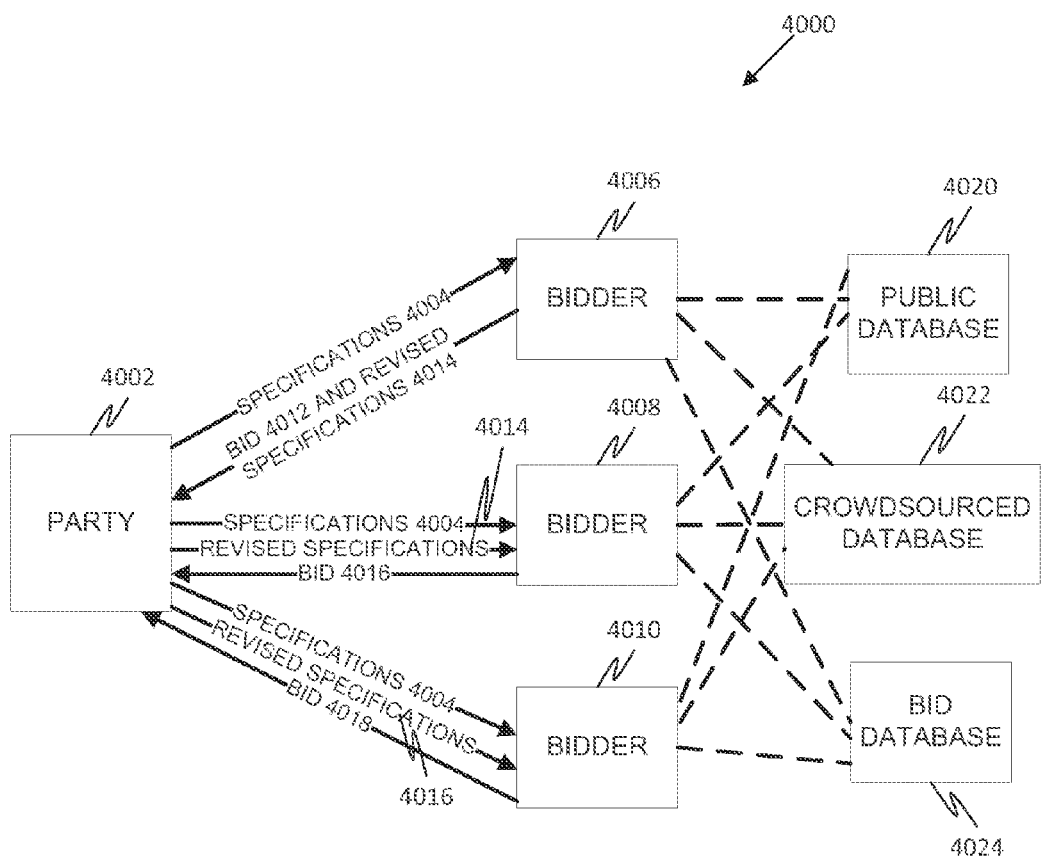
FIG. 40 is a diagram illustrating an information flow in accordance with an example embodiment.

FIG. 40 is a diagram illustrating an information flow 4000 in accordance with an example embodiment. As can be seen, party 4002 may submit information, such as specifications 4004, to each bidder 4006, 4008, 4010. One of the bidders, here bidder 4006, does not merely just reply with a bid to the specifications, but actually responds with both a bid 4012 and revised specifications 4014. The revised specifications 4014 are then transmitted from party 4002 to each of the other bidders 4008, 4010, who each can make their own bids 4016, 4018 based upon the revised specifications 4014, rather than on the original specifications 4004.

Figure 41:
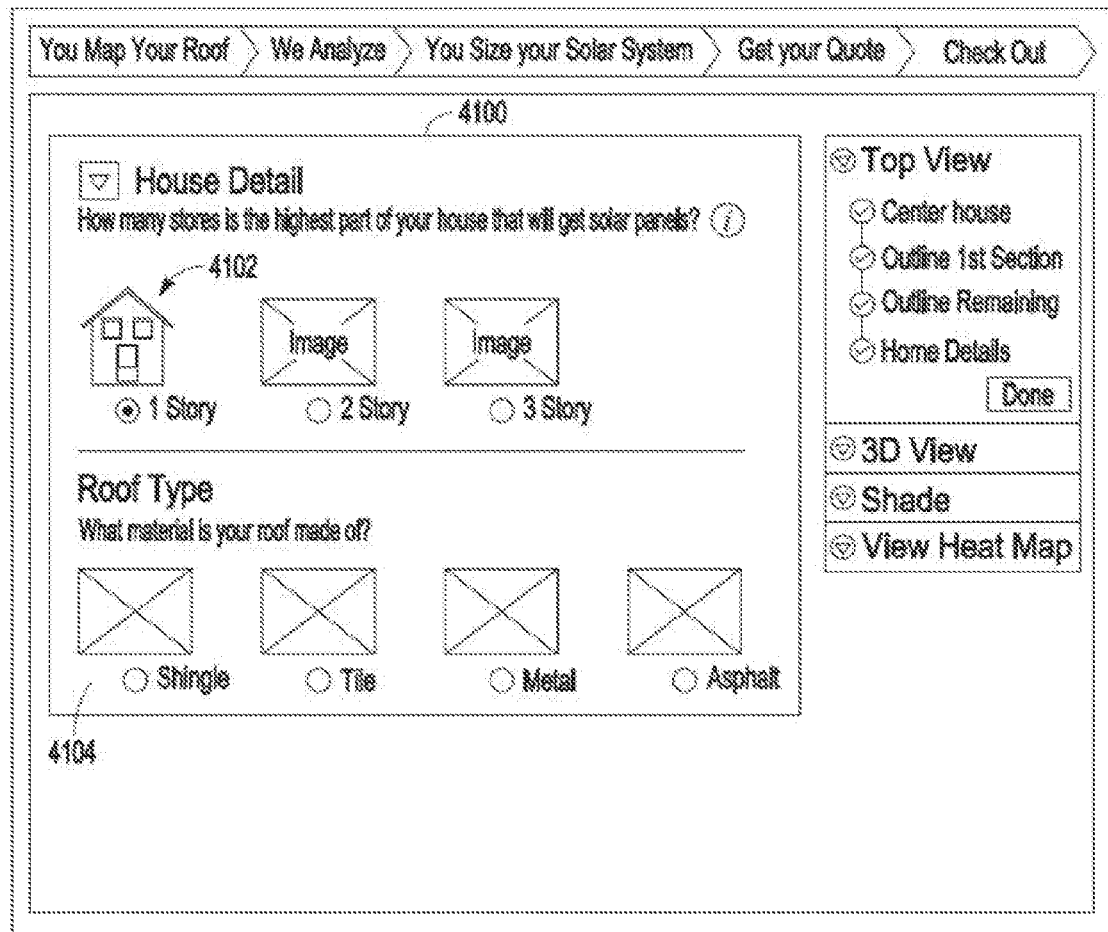
FIG. 41 is a screen capture illustrating a portion of a questionnaire in accordance with an example embodiment.

In an example embodiment, the original specifications 4004 may be based on a rough solar panel layout as created by the user, as described above, as well as on a questionnaire filled out by the user with additional details about the user's property or other specifications. FIG. 41 is a screen capture illustrating a portion of a questionnaire 4100 in accordance with an example embodiment. As can be seen, the user may indicate the number of stories 4102 of the house, as well as a roof material type 4104.

Referring back to FIG. 40, the bids from the bidders 4006, 4008, 4010 may not just be based on original specifications 4004 or updated specifications 4014, but may also be based on information derived from one or more public databases 4020 and one or more crowdsourced databases 4022. Public database 4020 may be, for example, a government county database (or a database that aggregates information from one or more government county databases) that contains information known to the government about the house. This may commonly include information used in property tax valuation, such as square footage, number of stories, lot size, location, etc. Any discrepancies between this information and the information provided in the original specifications 4004 may be brought to the attention of the party 4002. For example, the party 4002 may have indicated that the house is two stories while the public database 4020 shows a single story. The system may then query to the party 4002 as to which is correct. It is possible that the party 4002 committed a typo when entering the number of stories, and thus the original specifications 4004 would need to be corrected. It is also possible that the public database 4020 is incorrect, such as if the user has recently added a second story to their home.

The crowdsourced database 4022 may contain information obtained through crowdsourcing, e.g., submitted by other users. These users may either be homeowners themselves, such as neighbors, or may be other bidders 4006, 4008, 4010. In the latter case, information that is useful to multiple bidders may be shared between the bidders in order to more efficiently process bids. For example, information about how much permit fees are in certain areas may be shared among bidders 4006, 4008, 4010. This sharing of information may either be voluntary, or may be required as part of participation in the bidding process.

In an example embodiment, a bid database 4024 may be provided that is accessible to the bidders 4006, 4008, 4010. The bid database 4024 may contain some or even all the information about the bids from the bidders 4006, 4008, 4010. In this way, bidders 4006, 4008, 4010 may be able to see, for example, how competitive their bid is and subsequently reduce their price to obtain a better chance of being awarded the job. In some example embodiments, a system administrator or other entity may set a cap/recommended bid for the bids and this information may be communicated to the bidders 4006, 4008, 4010.

Figure 42:
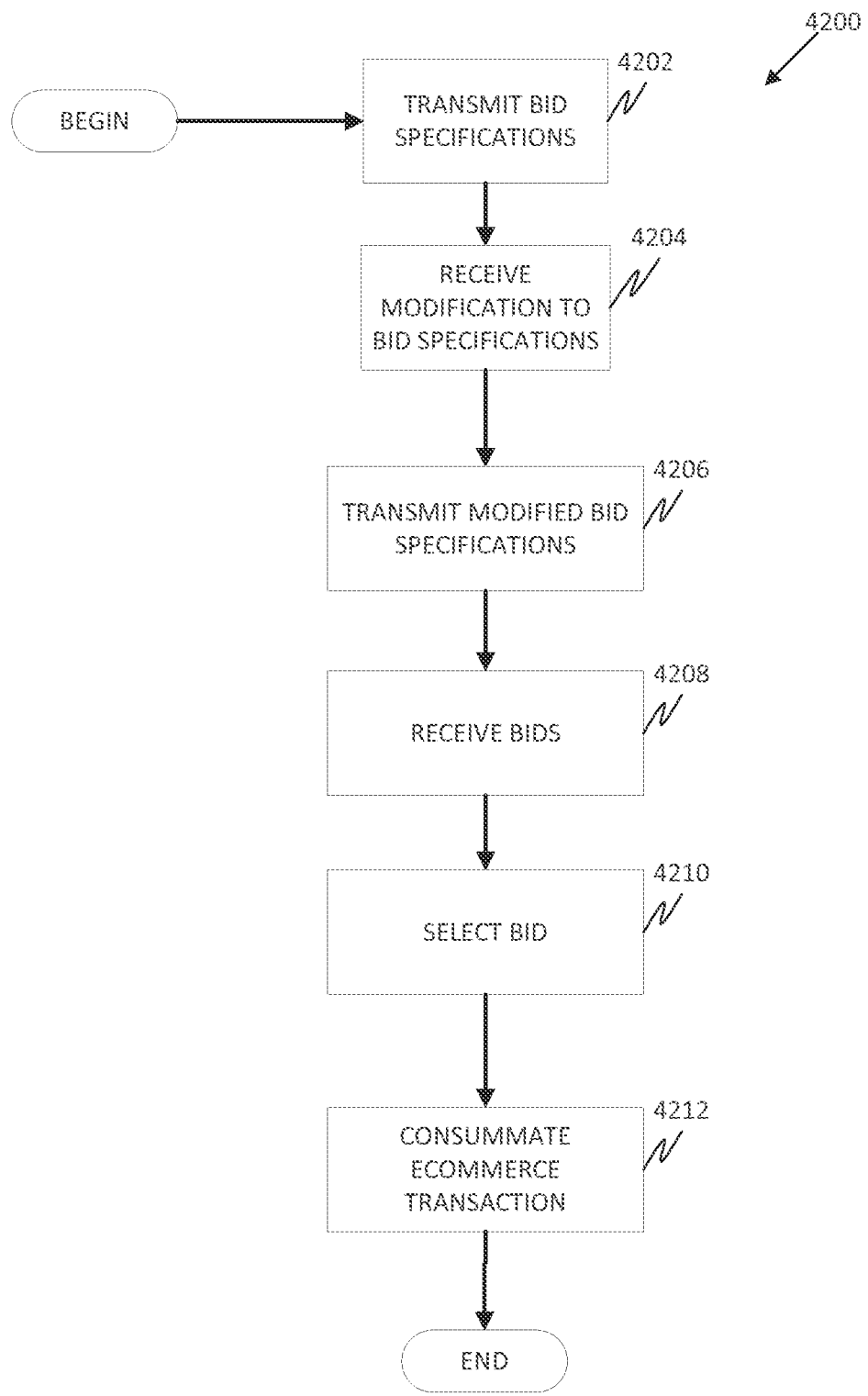
FIG. 42 is a flow diagram illustrating a method in accordance with another example embodiment.

FIG. 42 is a flow diagram illustrating a method 4200 in accordance with another example embodiment. At operation 4202, bid specifications for an ecommerce transaction are transmitted from a party requesting bids to a plurality of bidders. At operation 4204, a modification to the bid specifications is received from a first bidder of the plurality of bidders along with a bid in accordance with the modified bid specifications. At operation 4206, the modified bid specifications are transmitted to the plurality of bidders other than the first bidder. At operation 4208, bids in accordance with the modified bid specifications are received from each of the plurality of bidders other than the first bidder. At operation 4210, one of the bids is selected. At operation 4212, the ecommerce transaction is consummated based on the selected bid.

Example Mobile Device

Figure 43:
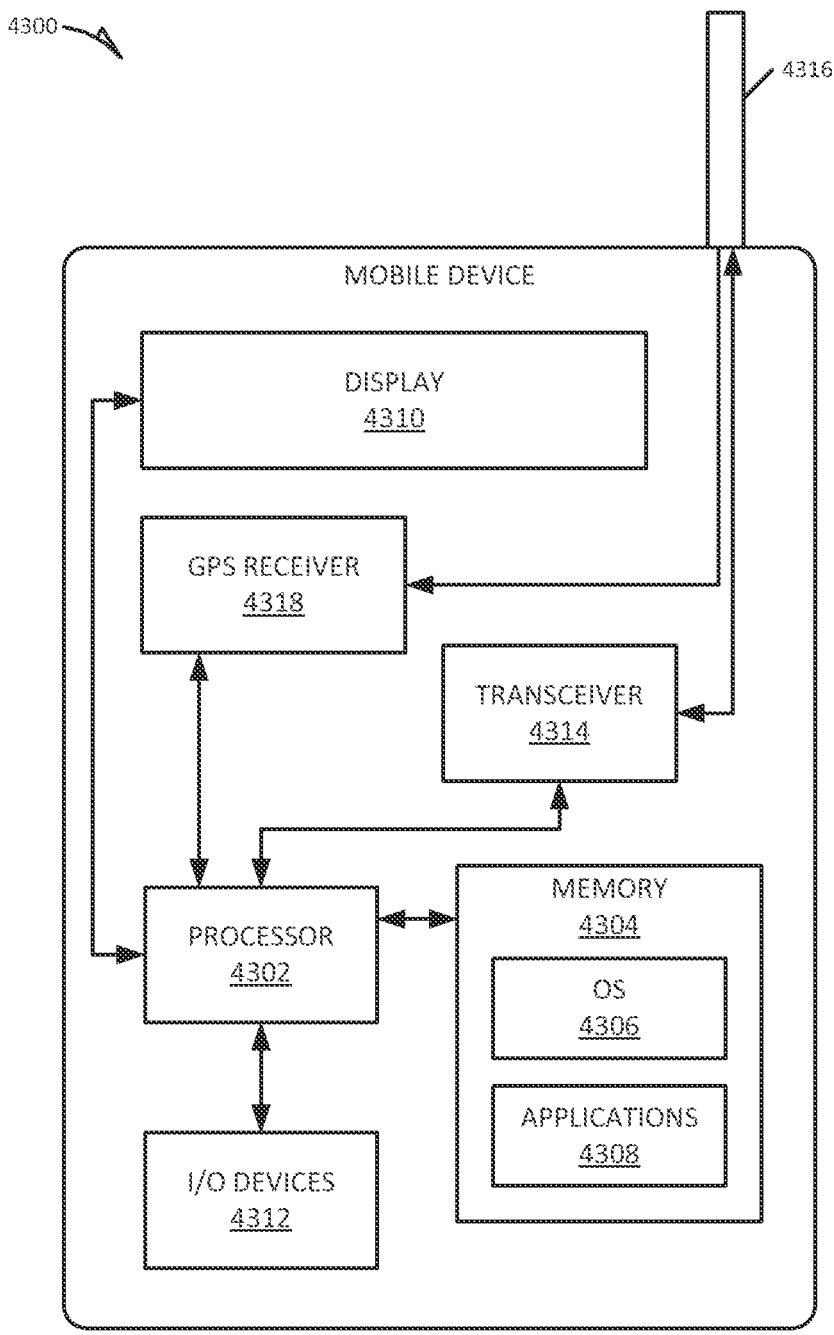
FIG. 43 is a block diagram illustrating a mobile device, according to an example embodiment.

FIG. 43 is a block diagram illustrating a mobile device 4300, according to an example embodiment. The mobile device 4300 may include a processor 4302. The processor 4302 may be any of a variety of different types of commercially available processors suitable for mobile devices (for example, an XScale architecture microprocessor, a microprocessor without interlocked pipeline stages (MIPS) architecture processor, or another type of processor 4302). A memory 4304, such as a random access memory (RAM), a flash memory, or other type of memory, is typically accessible to the processor 4302. The memory 4304 may be adapted to store an operating system (OS) 4306, as well as application programs 4308, such as a mobile location enabled application that may provide LBSs to a user. The processor 4302 may be coupled, either directly or via appropriate intermediary hardware, to a display 4310 and to one or more input/output (I/O) devices 4312, such as a keypad, a touch panel sensor, a microphone, and the like. Similarly, in some embodiments, the processor 4302 may be coupled to a transceiver 4314 that interfaces with an antenna 4316. The transceiver 4314 may be configured to both transmit and receive cellular network signals, wireless data signals, or other types of signals via the antenna 4316, depending on the nature of the mobile device 4300. Further, in some configurations, a GPS receiver 4318 may also make use of the antenna 4316 to receive GPS signals.

Modules, Components and Logic

Certain embodiments are described herein as including logic or a number of components, modules, or mechanisms. Modules may constitute either software modules (e.g., code embodied (1) on a non-transitory machine-readable medium or (2) in a transmission signal) or hardware-implemented modules. A hardware-implemented module is a tangible unit capable of performing certain operations and may be configured or arranged in a certain manner. In example embodiments, one or more computer systems (e.g., a standalone, client or server computer system) or one or more processors 4302 may be configured by software (e.g., an application or application portion) as a hardware-implemented module that operates to perform certain operations as described herein.

In various embodiments, a hardware-implemented module may be implemented mechanically or electronically. For example, a hardware-implemented module may comprise dedicated circuitry or logic that is permanently configured (e.g., as a special-purpose processor, such as a field programmable gate array (FPGA) or an application-specific integrated circuit (ASIC)) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Accordingly, the term "hardware-implemented module" should be understood to encompass a tangible entity, be that an entity that is physically constructed, permanently configured (e.g., hardwired) or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure processor 4302, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses that connect the hardware-implemented modules). In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation, and store the output of that operation in a memory device to which it is communicatively coupled. A further hardware-implemented module may then, at a later time, access the memory device to retrieve and process the stored output. Hardware-implemented modules may also initiate communications with input or output devices, and can operate on a resource (e.g., a collection of information).

The various operations of example methods described herein may be performed, at least partially, by one or more processors 4302 that are temporarily configured (e.g., by software) or permanently configured to perform the relevant operations. Whether temporarily or permanently configured, such processors 4302 may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors 4302 or processor-implemented modules. The performance of certain of the operations may be distributed among the one or more processors 4302, not only residing within a single machine, but deployed across a number of machines. In some example embodiments, the processor 4302 or processors 4302 may be located in a single location (e.g., within a home environment, an office environment or as a server farm), while in other embodiments the processors 4302 may be distributed across a number of locations.

The one or more processors 4302 may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

Electronic Apparatus and System

Example embodiments may be implemented in digital electronic circuitry, or in computer hardware, firmware, software, or in combinations of them. Example embodiments may be implemented using a computer program product, e.g., a computer program tangibly embodied in an information carrier, e.g., in a machine-readable medium for execution by, or to control the operation of, data processing apparatus, e.g., a programmable processor 4302, a computer, or multiple computers.

A computer program can be written in any form of programming language, including compiled or interpreted languages, and it can be deployed in any form, including as a stand-alone program or as a module, subroutine, or other unit suitable for use in a computing environment. A computer program can be deployed to be executed on one computer or on multiple computers at one site or distributed across multiple sites and interconnected by a communication network.

In example embodiments, operations may be performed by one or more programmable processors 4302 executing a computer program to perform functions by operating on input data and generating output. Method operations can also be performed by, and apparatus of example embodiments may be implemented as, special purpose logic circuitry, e.g., a field programmable gate array (FPGA) or an application-specific integrated circuit (ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor 4302), or a combination of permanently and temporarily configured hardware may be a design choice. Below are set out hardware (e.g., machine) and software architectures that may be deployed, in various example embodiments.

Example Machine Architecture and Machine-Readable Medium

Figure 44:
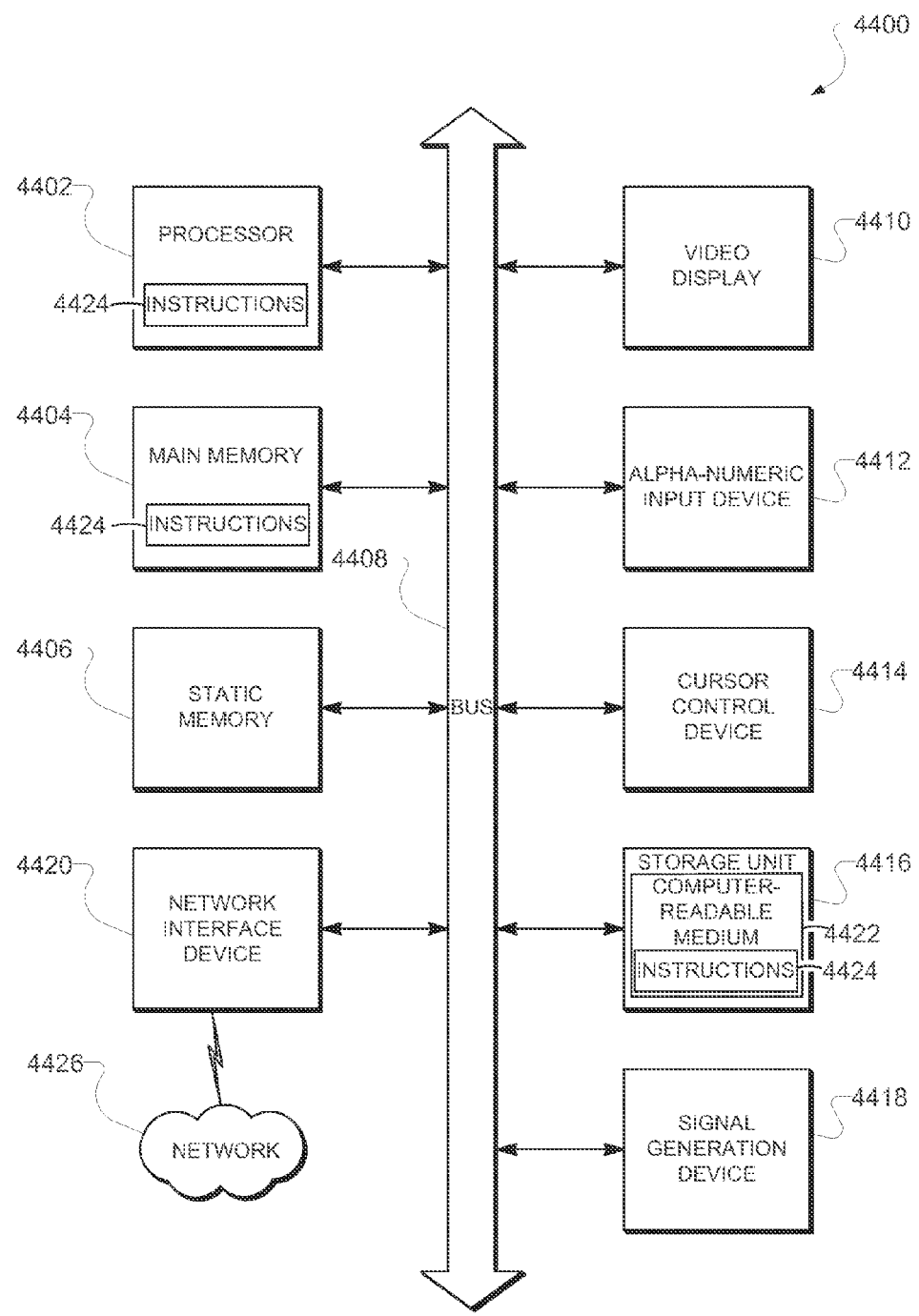
FIG. 44 is a block diagram of machine in the example form of a computer system within which instructions may be executed for causing the machine to perform any one or more of the methodologies discussed herein.

FIG. 44 is a block diagram of machine in the example form of a computer system 4400 within which instructions 4424 may be executed for causing the machine to perform any one or more of the methodologies discussed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a personal digital assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 4400 includes a processor 4402 (e.g., a central processing unit (CPU), a graphics processing unit (GPU), or both), a main memory 4404 and a static memory 4406, which communicate with each other via a bus 4408. The computer system 4400 may further include a video display unit 4410 (e.g., a liquid crystal display (LCD) or a cathode ray tube (CRT)). The computer system 4400 also includes an alphanumeric input device 4412 (e.g., a keyboard or a touch-sensitive display screen), a user interface (UI) navigation (e.g., cursor control) device 4414 (e.g., a mouse), a data storage unit 4416, a signal generation device 4418 (e.g., a speaker) and a network interface device 4420.

Machine-Readable Medium

The data storage unit 4416 includes a computer-readable medium 4422 on which is stored one or more sets of data structures and instructions 4424 (e.g., software) embodying or utilized by any one or more of the methodologies or functions described herein. The instructions 4424 may also reside, completely or at least partially, within the main memory 4404 and/or within the processor 4402 during execution thereof by the computer system 4400, the main memory 4404 and the processor 4402 also constituting computer-readable media 4422.

While the computer-readable medium 4422 is shown in an example embodiment to be a single medium, the term "computer-readable medium" may include a single medium or multiple media (e.g., a centralized or distributed database, and/or associated caches and servers) that store the one or more instructions 4424 or data structures. The term "computer-readable medium" shall also be taken to include any tangible medium that is capable of storing, encoding or carrying instructions 4424 for execution by the machine and that cause the machine to perform any one or more of the methodologies of the present disclosure or that is capable of storing, encoding or carrying data structures utilized by or associated with such instructions 4424. The term "computer-readable medium" shall accordingly be taken to include, but not be limited to, solid-state memories, and optical and magnetic media. Specific examples of computer-readable media 4422 include non-volatile memory, including by way of example semiconductor memory devices, e.g., erasable programmable read-only memory (EPROM), electrically erasable programmable read-only memory (EEPROM), and flash memory devices; magnetic disks such as internal hard disks and removable disks; magneto-optical disks; and CD-ROM and DVD-ROM disks.

Transmission Medium

The instructions 4424 may further be transmitted or received over a communications network 4426 using a transmission medium. The instructions 4424 may be transmitted using the network interface device 4420 and any one of a number of well-known transfer protocols (e.g., HTTP). Examples of communication networks include a local area network ("LAN"), a wide area network ("WAN"), the Internet, mobile telephone networks, plain old telephone (POTS) networks, and wireless data networks (e.g., WiFi and WiMax networks). The term "transmission medium" shall be taken to include any intangible medium that is capable of storing, encoding or carrying instructions 4424 for execution by the machine, and includes digital or analog communications signals or other intangible media to facilitate communication of such software.

Although the inventive subject matter has been described with reference to specific example embodiments, it will be evident that various modifications and changes may be made to these embodiments without departing from the broader spirit and scope of the disclosure. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. An apparatus comprising:
    a three dimensional solar installation mapping tool executable by a processor and configured to:
        identify a first set of estimated locations for calibration points in a roof in a first satellite image, the first satellite image having a first zoom level and a first angle relative to ground;
        identify a second set of estimate locations for the calibration points in the roof in a second satellite image, the second satellite image having a second zoom level and a second angle relative to ground;
        derive actual locations for the calibration points using the first and second sets of estimated locations, the first and second zoom levels, and the first and second angles;
        calculate dimension information for the roof based on the derived actual locations for the calibration points;
        create a roof mapping using the dimension information;
        identify one or more keep out areas on the roof mapping, the keep out areas identifying areas where a solar panel should not be installed; and
        create a layout of a solar panel installation using the roof mapping and the keep out areas.

2. The apparatus of claim 1, wherein the first set of estimated locations include an indication of each calibration point's location along an x-axis and along a y-axis.

3. The apparatus of claim 2, wherein the deriving of actual locations for the calibration points includes estimating each calibration point's location along a z-axis using the first and second zoom levels.

4. The apparatus of claim 1, wherein the one or more keep out areas include an area that is obstructed by a tree.

5. The apparatus of claim 1, wherein the three dimensional solar installation mapping tool is further configured to utilize astronomical information to identify the one or more keep out areas.

6. The apparatus of claim 5, wherein the three dimensional solar installation mapping tool is further configured to utilize historical weather information to identify the one or more keep out areas.

7. The apparatus of claim 1, wherein the first set of estimated locations for calibration points is identified by receiving estimated calibration points from a user via an interface allowing the user to click and drag the calibration points as an overlay to the first satellite image.

8. A method comprising:
    identifying a first set of estimated locations for calibration points in a roof in a first satellite image, the first satellite image having a first zoom level and a first angle relative to ground;
    identifying a second set of estimate locations for the calibration points in the roof in a second satellite image, the second satellite image having a second zoom level and a second angle relative to ground;
    deriving actual locations for the calibration points using the first and second sets of estimated locations, the first and second zoom levels, and the first and second angles;
    calculating dimension information for the roof based on the derived actual locations for the calibration points;
    creating a roof mapping using the dimension information;
    identifying one or more keep out areas on the roof mapping, the keep out areas identifying areas where a solar panel should not be installed; and creating a layout of a solar panel installation using the roof mapping and the keep out areas.

9. The method of claim 8, wherein the first set of estimated locations include an indication of each calibration point's location along an x-axis and along a y-axis.

10. The method of claim 9, wherein the deriving of actual locations for the calibration points includes estimating each calibration point's location along a z-axis using the first and second zoom levels.

11. The method of claim 8, wherein the one or more keep out areas include an area that is obstructed by a tree.

12. The method of claim 8, further comprising utilizing astronomical information to identify the one or more keep out areas.

13. The method of claim 12, further comprising utilizing historical weather information to identify the one or more keep out areas.

14. The method of claim 8, wherein the first set of estimated locations for calibration points is identified by receiving estimated calibration points from a user via an interface allowing the user to click and drag the calibration points as an overlay to the first satellite image.

15. A non-transitory machine-readable storage medium having embodied thereon instructions executable by one or more machines to perform operations comprising:
    identifying a first set of estimated locations for calibration points in a roof in a first satellite image, the first satellite image having a first zoom level and a first angle relative to ground;
    identifying a second set of estimate locations for the calibration points in the roof in a second satellite image, the second satellite image having a second zoom level and a second angle relative to ground;
    deriving actual locations for the calibration points using the first and second sets of estimated locations, the first and second zoom levels, and the first and second angles;
    calculating dimension information for the roof based on the derived actual locations for the calibration points;
    creating a roof mapping using the dimension information;
    identifying one or more keep out areas on the roof mapping, the keep out areas identifying areas where a solar panel should not be installed; and
    creating a layout of a solar panel installation using the roof mapping and the keep out areas.

16. The non-transitory machine-readable storage medium of claim 15, wherein the first set of estimated locations include an indication of each calibration point's location along an x-axis and along a y-axis.

17. The non-transitory machine-readable storage medium of claim 16, wherein the deriving of actual locations for the calibration points includes estimating each calibration point's location along a z-axis using the first and second zoom levels.

18. The non-transitory machine-readable storage medium of claim 15, wherein the one or more keep out areas include an area that is obstructed by a tree.

19. The non-transitory machine-readable storage medium of claim 15, further comprising utilizing astronomical information to identify the one or more keep out areas.

20. The non-transitory machine-readable storage medium of claim 19, further comprising utilizing historical weather information to identify the one or more keep out areas.

* * * * *